(12) United States Patent
Ahn et al.

(10) Patent No.: US 7,045,586 B2
(45) Date of Patent: May 16, 2006

(54) ADHESIVES HAVING IMPROVED CHEMICAL RESISTANCE AND CURABLE SILICONE COMPOSITIONS FOR PREPARING THE ADHESIVES

(75) Inventors: Dongchan Ahn, Midland, MI (US); Patricia Ann Rolley, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 178 days.

(21) Appl. No.: 10/641,758

(22) Filed: Aug. 14, 2003

(65) Prior Publication Data

US 2005/0038217 A1    Feb. 17, 2005

(51) Int. Cl.
C08G 77/08 (2006.01)
(52) U.S. Cl. .............. 528/26; 528/15; 528/42
(58) Field of Classification Search ........... 528/15, 528/42, 26
See application file for complete search history.

(56) References Cited

U.S. PATENT DOCUMENTS

| | | | |
|---|---|---|---|
| 2,676,182 A | 4/1954 | Daudt et al. ............. 260/448.2 |
| 3,159,601 A | 12/1964 | Ashby ....................... 260/46.5 |
| 3,220,972 A | 11/1965 | Lamoreaux ............... 260/46.5 |
| 3,296,291 A | 1/1967 | Chalk et al. .............. 260/448.2 |
| 3,419,593 A | 12/1968 | Willing ..................... 260/448.2 |
| 3,445,420 A | 5/1969 | Kookootsedes et al. ...... 260/37 |
| 3,516,946 A | 6/1970 | Modic ........................ 252/429 |
| 3,814,730 A | 6/1974 | Karstedt .................... 260/46.5 |
| 3,975,362 A | 8/1976 | Kim et al. .................. 260/46.5 |
| 3,989,667 A | 11/1976 | Lee et al. .................. 260/46.5 |
| 3,989,668 A | 11/1976 | Lee et al. .................. 260/46.5 |
| 4,087,585 A | 5/1978 | Schulz ......................... 260/37 |
| 4,273,902 A | 6/1981 | Tomioka et al. ............ 525/478 |
| 4,348,454 A | 9/1982 | Eckberg ...................... 428/334 |
| 4,355,121 A | 10/1982 | Evans ......................... 523/213 |
| 4,360,610 A | 11/1982 | Murray et al. ............... 523/212 |
| 4,370,358 A | 1/1983 | Hayes et al. ................ 427/54.1 |
| 4,386,170 A | 5/1983 | Monroe ...................... 523/210 |
| 4,492,786 A | 1/1985 | Evans et al. ................ 524/866 |
| 4,500,447 A | 2/1985 | Kobayashi et al. ......... 252/511 |
| 4,584,355 A | 4/1986 | Blizzard et al. ............ 525/477 |
| 4,584,361 A | 4/1986 | Janik et al. .................. 528/15 |
| 4,585,836 A | 4/1986 | Homan et al. .............. 525/477 |
| 4,591,622 A | 5/1986 | Blizzard et al. ............ 525/477 |
| 4,707,531 A | 11/1987 | Shirahata .................... 528/12 |
| 4,766,176 A | 8/1988 | Lee et al. .................... 525/100 |
| 4,784,879 A | 11/1988 | Lee et al. ................ 427/213.34 |
| 4,818,805 A | 4/1989 | Ikeno et al. .................. 528/15 |
| 4,980,413 A | 12/1990 | Kasuya ....................... 524/730 |
| 5,017,654 A | 5/1991 | Togashi et al. ............. 525/100 |
| 5,036,117 A | 7/1991 | Chung et al. ............... 522/172 |
| 5,082,706 A | 1/1992 | Tangney | |
| 5,091,135 A | 2/1992 | Okada et al. | |
| 5,120,810 A | 6/1992 | Fujiki et al. .................. 528/15 |
| 5,175,325 A | 12/1992 | Brown et al. ................... 556/9 |
| 5,194,649 A | 3/1993 | Okawa ........................ 556/451 |
| 5,204,436 A | 4/1993 | Kishita et al. ................ 528/15 |
| 5,248,715 A * | 9/1993 | Gray et al. .................. 524/265 |
| 5,254,623 A * | 10/1993 | Watson ....................... 525/100 |
| 5,302,632 A | 4/1994 | Maxson ...................... 523/213 |
| 5,310,843 A | 5/1994 | Morita ........................ 528/15 |
| 5,349,037 A | 9/1994 | Fujiki et al. .................. 528/15 |
| 5,399,602 A | 3/1995 | Matsushita et al. ......... 524/267 |
| 5,405,929 A | 4/1995 | Kobayashi ................... 528/15 |
| 5,447,987 A | 9/1995 | Sato et al. ................... 524/731 |
| 5,482,775 A | 1/1996 | Miyabayashi ............... 428/391 |
| 5,578,381 A | 11/1996 | Hamada et al. ............. 428/447 |
| 5,616,403 A | 4/1997 | Eckberg et al. ............. 428/215 |
| 5,665,794 A | 9/1997 | Maxson et al. ............. 523/209 |
| 5,684,060 A | 11/1997 | Konings et al. ............ 523/109 |
| 5,696,211 A * | 12/1997 | Chung et al. ............... 525/478 |
| 5,744,507 A | 4/1998 | Angell et al. ................ 521/86 |
| 5,756,598 A | 5/1998 | Chung et al. ............... 525/478 |
| 5,777,047 A * | 7/1998 | Chung et al. ............... 525/478 |
| 5,824,736 A | 10/1998 | Kobayashi et al. ......... 524/588 |
| 5,989,719 A | 11/1999 | Loiselle ..................... 428/447 |
| 6,056,976 A | 5/2000 | Markkula et al. ........... 424/486 |

(Continued)

FOREIGN PATENT DOCUMENTS

EP    0 370 689    11/1989

(Continued)

OTHER PUBLICATIONS

ABSTRACT CA2009072, 19900820, Kasuya, A., Adhesion promoter for curable organopolysiloxane compsns.— exhibiting excellent adhesion to organic and inorganic substrates in the cured form.

(Continued)

*Primary Examiner*—Margaret G. Moore
(74) *Attorney, Agent, or Firm*—Catherine U. Brown

(57) ABSTRACT

This invention relates to a composition that can be cured to form an adhesive. The adhesive is useful in the electronics industry. The composition is prepared by mixing components including:
(I) a polyorganosiloxane having an average of at least two terminally-unsaturated organic groups per molecule,
(II) an organohydrogenpolysiloxane having an average of at least two silicon-bonded hydrogen atoms per molecule,
(III) a hydrosilylation catalyst,
(IV) a fluoroorganosilicone having at least one functional group reactive with component (I), component (II), or both,
(V) an unsaturated ester-functional compound, and
(VI) an adhesion promoter.

The composition may also include one or more optional components selected from (VII) a void reducing agent, (VIII) a pigment, (IX) a filler, (X) a cure modifier, (XI) a rheology modifier, and (XII) a spacer.

22 Claims, 4 Drawing Sheets

U.S. PATENT DOCUMENTS

| | | | |
|---|---|---|---|
| 6,074,703 A | 6/2000 | Eckberg et al. | 427/387 |
| 6,169,142 B1 | 1/2001 | Nakano et al. | 524/862 |
| 6,362,554 B1 | 3/2002 | Neal | |
| 6,685,855 B1 | 2/2004 | Miller et al. | |
| 6,794,035 B1 | 9/2004 | Tobita et al. | |
| 2002/0014810 A1 | 2/2002 | Maruyama | |
| 2002/0032270 A1 | 3/2002 | Azechi | 524/492 |
| 2002/0137842 A1 | 9/2002 | Sato et al. | 525/100 |
| 2003/0071382 A1 | 4/2003 | Neal | |

FOREIGN PATENT DOCUMENTS

| | | |
|---|---|---|
| EP | 0384352 A2 | 8/1990 |
| EP | 0493791 A1 | 12/1991 |
| EP | 0347895 B1 | 11/1993 |
| EP | 0596534 A2 | 5/1994 |
| EP | 0 655 483 | 11/1994 |
| EP | 0661335 A1 | 7/1995 |
| EP | 0497349 B1 | 6/1996 |
| EP | 0 655 471 B1 | 2/1997 |
| EP | 0 590 595 B1 | 10/1997 |
| EP | 0802234 A2 | 10/1997 |
| EP | 0 850 999 A2 | 7/1998 |
| EP | 0850997 A2 | 7/1998 |
| EP | 0934981 A2 | 8/1999 |
| EP | 0985710 A1 | 3/2000 |
| EP | 0 503 975 B1 | 11/2001 |
| EP | 1172414 A2 | 1/2002 |
| EP | 1 006 145 B1 | 2/2003 |
| EP | 1 148 098 A1 | 5/2003 |
| EP | 1 264 865 B1 | 5/2004 |
| GB | 2300861 A | 11/1996 |
| JP | 63-48901 | 6/1983 |
| JP | 11005902 | 1/1999 |
| JP | 11035828 | 2/1999 |
| JP | 2000-078679 | 5/2000 |

OTHER PUBLICATIONS

ABSTRACT JP06172654, 19940621, Shinetsu Chem. Ind. Co. Ltd., Organopolysiloxane compsn. with strong adhesion—comprises alkenyl gp.-contg. organopolysiloxane with at least one silicon-linked fluorine-contg. substit.

ABSTRACT JP06256660, 19940913, Shinetsu Chem. Ind. Co. Ltd., Fluoro silicone ruber compsn. of good compatibility of polysiloxane components—contg. specified fluoropolysiloxane, per fluoroalkyl gp. contg. siloxane, epoxy gp. contg. hydrogen polysiloxane, and platinum@ based catalyst.

ABSTRACT JP06239916A, Nov. 11, 1994, Shin Etsu Chem. Co. Ltd., Organopolysiloxane Composition.

ABSTRACT JP02123162A, May 10, 1990, Shin Etsu Chem. Co. Ltd., Curable Organopolysiloxane Composition.

* cited by examiner

ADHESIVES HAVING IMPROVED CHEMICAL RESISTANCE AND CURABLE SILICONE COMPOSITIONS FOR PREPARING THE ADHESIVES

FIELD OF THE INVENTION

This invention relates to curable silicone compositions and products formed by curing the curable silicone compositions. More particularly, this invention relates to hydrosilylation-curable compositions that cure to form products having improved adhesion and chemical resistance.

BACKGROUND OF THE INVENTION

Plastics containing low surface energy polymers, e.g., blends of Nylon and syndiotactic polystyrene (sPS), are seeing growing acceptance as a replacement for denser, hygroscopic plastics such as polybutyleneterephthalate (PBT) and Nylon as substrates in high performance applications such as those found in the electronics and automotive industries. For example, existing adhesives used in the electronics industry suffer from the drawback of having poor adhesion to substrates containing syndiotactic polystyrene. Therefore, there is a need for developing adhesives having improved adhesion to substrates containing sPS while retaining adhesion to a variety of other organic and inorganic substrates.

Furthermore, polyorganosiloxane elastomer adhesives, such as polydimethylsiloxane-based elastomers, are frequently used in the electronics industry for properties such as their thermal stability and ability to relieve stresses over a broad thermal range. However, these adhesives may suffer from the drawback of poor resistance to some organic chemicals, such as solvents and engine oils. Fluorosilicone elastomers and organic elastomers have been used to improve chemical resistance. However, fluorosilicone elastomers suffer from the drawback of having higher cost than polyorganosiloxane elastomers (that are non-fluorinated). One proposed approach to address this is to combine fluorosilicone elastomers with polyorganosiloxane elastomers. However, proposed approach has generally not been used due to concerns that the fluorosilicone and non-fluorinated organosilicone components would phase separate, resulting in unstable properties. Organic elastomers may suffer from the drawback of having insufficient flexibility or bulk thermal properties. Therefore, there is a need in the electronics industry for adhesives having improved chemical resistance while retaining flexibility and bulk thermal properties.

SUMMARY OF THE INVENTION

This invention relates to a composition prepared by mixing components comprising:
(I) a polyorganosiloxane having an average of at least two unsaturated organic groups per molecule,
(II) an organohydrogenpolysiloxane having an average of at least two silicon-bonded hydrogen atoms per molecule,
(III) a hydrosilylation catalyst,
(IV) a fluoroorganosilicone having at least one functional group reactive with component (I), component (II), or both,
(V) an unsaturated ester-functional compound, and
(VI) an adhesion promoter.

Component (I) is free of fluorine atoms. Component (II) is free of fluorine atoms.

DETAILED DESCRIPTION OF THE INVENTION

All amounts, ratios, and percentages are by weight unless otherwise indicated. The following is a list of definitions, as used herein.

Definitions and Usage of Terms

"A" and "an" each mean one or more.
"Chemical resistance" means reduced tendency of a silicone elastomer to swell, or degrade, or both, when exposed to solvents and oils.
"Combination" means two or more items put together by any method.
The abbreviation "cP" means centipoise.
The abbreviation "IR" means infrared.
"Pa·s" means Pascal seconds.
The abbreviation "ppm" means parts per million.
"Silicone" and "siloxane" are used interchangeably herein.

This invention relates to a composition prepared by mixing components comprising:
(I) a polyorganosiloxane having an average of at least two unsaturated organic groups per molecule,
(II) an organohydrogenpolysiloxane having an average of at least two silicon bonded hydrogen atoms per molecule,
(III) a hydrosilylation catalyst,
(IV) a fluoroorganosilicone having at least one functional group reactive with component (I), component (II), or both,
(V) an unsaturated ester-functional compound, and
(VI) an adhesion promoter.

Component (I) Polyorganosiloxane

Component (I) is a polyorganosiloxane having an average of at least two unsaturated organic groups per molecule. Component (I) may have a linear, branched, or resinous structure. Component (I) may be a homopolymer or a copolymer. The unsaturated organic groups may be alkenyl groups having from 2 to 12 carbon atoms and are exemplified by, but not limited to, vinyl, allyl, butenyl, and hexenyl. The unsaturated organic groups may be alkynyl groups having 2 to 12 carbon atoms, and are exemplified by, but not limited to, ethynyl, propynyl, and butynyl. Alternatively, the unsaturated organic groups may contain acrylate-functional or methacrylate-functional groups and are exemplified by, but not limited to, acryloyloxyalkyl such as acryloyloxypropyl and methacryloyloxyalkyl such as methacryloyloxypropyl. The unsaturated organic groups in component (I) may be located at terminal, pendant, or both terminal and pendant positions.

The remaining silicon-bonded organic groups in component (I) may be monovalent organic groups free of aliphatic unsaturation. These monovalent organic groups may have 1 to 20 carbon atoms, alternatively 1 to 10 carbon atoms, and are exemplified by, but not limited to alkyl such as methyl, ethyl, propyl, pentyl, octyl, undecyl, and octadecyl; cycloalkyl such as cyclohexyl; aryl such as phenyl, tolyl, xylyl, benzyl, and 2-phenylethyl; and cyano-functional groups such as cyanoalkyl groups exemplified by cyanoethyl and cyanopropyl. Component (I) is free of fluorine atoms.

The viscosity of component (I) is not specifically restricted, however, component (I) may have a viscosity of 0.05 to 500 Pa·s at 25° C., alternatively 0.1 to 200 Pa·s at 25° C. Component (I) is added to the composition in an amount of 100 weight parts.

Component (I) may comprise a polyorganosiloxane of the formula
(a) $R^1_3SiO(R^1_2SiO)_\alpha(R^1R^2SiO)_\beta SiR^1_3$,
(b) $R^3_2R^4SiO(R^3_2SiO)_\chi(R^3R^4SiO)_\delta SiR^3_2R^4$, or
(c) a combination thereof.

In formula (a), $\alpha$ has an average value of 0 or 2000, and $\beta$ has an average value of 2 to 2000. Each $R^1$ is independently a monovalent organic group. Suitable monovalent organic groups include, but are not limited to, acrylic functional groups such as acryloyloxypropyl and methacryloyloxypropyl; alkyl groups such as methyl, ethyl, propyl, and butyl; alkenyl groups such as vinyl, allyl, and butenyl; alkynyl groups such as ethynyl and propynyl; aromatic groups such as phenyl, tolyl, and xylyl; and cyanoalkyl groups such as cyanoethyl and cyanopropyl. Each $R^2$ is independently an unsaturated monovalent organic group. $R^2$ is exemplified by alkenyl groups such as vinyl, allyl, and butenyl and alkynyl groups such as ethynyl and propynyl, and acrylic functional groups such as acryloyloxypropyl and methacryloyloxypropyl.

In formula (b), $\chi$ has an average value of 0 to 2000, and $\delta$ has an average value of 0 to 2000. Each $R^3$ is independently a monovalent organic group. Suitable monovalent organic groups include, but are not limited to, acrylic functional groups such as acryloyloxypropyl and methacryloyloxypropyl; alkyl groups such as methyl, ethyl, propyl, and butyl; alkenyl groups such as vinyl, allyl, and butenyl; alkynyl groups such as ethynyl and propynyl; aromatic groups such as phenyl, tolyl, and xylyl; and cyanoalkyl groups such as cyanoethyl and cyanopropyl. Each $R^4$ is independently an unsaturated organic hydrocarbon group. $R^4$ is exemplified by alkenyl groups such as vinyl, allyl, and butenyl; alkynyl groups such as ethynyl and propynyl; and acrylic functional groups such as acryloyloxypropyl and methacryloyloxypropyl.

Component (I) may comprise polydiorganosiloxanes such as
i) dimethylvinylsiloxy-terminated polydimethylsiloxane,
ii) dimethylvinylsiloxy-terminated poly(dimethylsiloxane/methylvinylsiloxane),
iii) dimethylvinylsiloxy-terminated polymethylvinylsiloxane,
iv) trimethylsiloxy-terminated poly(dimethylsiloxane/methylvinylsiloxane),
v) trimethylsiloxy-terminated polymethylvinylsiloxane,
vi) dimethylvinylsiloxy-terminated poly(dimethylsiloxane/methylphenylsiloxane),
vii) dimethylvinylsiloxy-terminated poly(dimethylsiloxane/diphenylsiloxane),
viii) phenyl,methyl,vinyl-siloxy-terminated polydimethylsiloxane,
ix) dimethyl-acryloyloxypropyl-siloxy-terminated polydimethylsiloxane,
x) dimethyl-methacryloyloxypropyl-siloxy-terminated polydimethylsiloxane,
xi) dimethylhexenylsiloxy-terminated polydimethylsiloxane,
xii) dimethylhexenylsiloxy-terminated poly(dimethylsiloxane/methylhexenylsiloxane),
xiii) dimethylhexenylsiloxy-terminated polymethylhexenylsiloxane,
xiv) trimethylsiloxy-terminated poly(dimethylsiloxane/methylhexenylsiloxane),
xv) dimethylvinylsiloxy-terminated poly(dimethylsiloxane/methylcyanopropylsiloxane), and
xvi) combinations thereof.

Methods of preparing polydiorganosiloxanes suitable for use as component (I), such as hydrolysis and condensation of the corresponding organohalosilanes or equilibration of cyclic polydiorganosiloxanes, are well known in the art.

Component (I) may comprise resins such as an MQ resin consisting essentially of $R^5_3SiO_{1/2}$ units and $SiO_{4/2}$ units, a TD resin consisting essentially of $R^5SiO_{3/2}$ units and $R^5_2SiO_{2/2}$ units, an MT resin consisting essentially of $R^5_3SiO_{1/2}$ units and $R^5SiO_{3/2}$ units, an MTD resin consisting essentially of $R^5_3SiO_{1/2}$ units, $R^5SiO_{3/2}$ units, and $R^5_2SiO_{2/2}$ units, or a combination thereof.

Each $R^5$ is a monovalent organic group. The monovalent organic groups represented by $R^5$ may have 1 to 20 carbon atoms, alternatively 1 to 10 carbon atoms. Examples of monovalent organic groups include, but are not limited to, acrylate functional groups such as acryloxyalkyl groups, methacrylate functional groups such as methacryloxyalkyl groups, cyano-functional groups, and monovalent hydrocarbon groups. Monovalent hydrocarbon groups include, but are not limited to, alkyl such as methyl, ethyl, propyl, pentyl, octyl, undecyl, and octadecyl; cycloalkyl such as cyclohexyl; alkenyl such as vinyl, allyl, butenyl, and hexenyl; alkynyl such as ethynyl, propynyl, and butynyl; and aryl such as phenyl, tolyl, xylyl, benzyl, and 2-phenylethyl. Cyano-functional groups include, but are not limited to cyanoalkyl groups such as cyanoethyl and cyanopropyl.

The resin may contain an average of 3 to 30 mole percent of unsaturated organic groups. The unsaturated organic groups may be alkenyl groups, alkynyl groups, acrylate-functional groups, methacrylate-functional groups, or combinations thereof. The mole percent of unsaturated organic groups in the resin is the ratio of the number of moles of unsaturated group-containing siloxane units in the resin to the total number of moles of siloxane units in the resin, multiplied by 100.

Methods of preparing resins are well known in the art. For example, resin may be prepared by treating a resin copolymer produced by the silica hydrosol capping process of Daudt et al. with at least an alkenyl-containing endblocking reagent. The method of Daudt et al., is disclosed in U.S. Pat. No. 2,676,182.

Briefly stated, the method of Daudt et al. involves reacting a silica hydrosol under acidic conditions with a hydrolyzable triorganosilane such as trimethylchlorosilane, a siloxane such as hexamethyldisiloxane, or mixtures thereof, and recovering a copolymer having M and Q units. The resulting copolymers generally contain from 2 to 5 percent by weight of hydroxyl groups.

The resin, which typically contains less than 2 percent by weight of silicon-bonded hydroxyl groups, may be prepared by reacting the product of Daudt et al. with an unsaturated organic group-containing endblocking agent and an endblocking agent free of aliphatic unsaturation, in an amount sufficient to provide from 3 to 30 mole percent of unsaturated organic groups in the final product. Examples of endblocking agents include, but are not limited to, silazanes, siloxanes, and silanes. Suitable endblocking agents are known in the art and exemplified in U.S. Pat. Nos. 4,584,355; 4,591,622; and 4,585,836. A single endblocking agent or a mixture of such agents may be used to prepare the resin.

Component (I) can be a single polyorganosiloxane or a combination comprising two or more polyorganosiloxanes that differ in at least one of the following properties: structure, viscosity, average molecular weight, siloxane units, and sequence.

Component (II) Organohydrogenpolysiloxane

Component (II) is an organohydrogenpolysiloxane having an average of at least two silicon-bonded hydrogen atoms per molecule. Component (II) can be can be a homopolymer or a copolymer. Component (II) can have a linear, branched, cyclic, or resinous structure. The silicon-bonded hydrogen atoms in the component (II) can be located at terminal, pendant, or at both terminal and pendant positions. Component (II) is free of fluorine atoms.

Component (II) can comprise siloxane units including, but not limited to, $HR^6_2SiO_{1/2}$, $R^6_3SiO_{1/2}$, $HR^6SiO_{2/2}$, $R^6_2SiO_{2/2}$, $R^6SiO_{3/2}$, and $SiO_{4/2}$ units. In the preceding formulae, each $R^6$ is independently selected from monovalent organic groups free of aliphatic unsaturation.

Component (II) may comprise a compound of the formula
(a) $R^7_3SiO(R^7_2SiO)_\epsilon(R^7HSiO)_\phi SiR^7_3$, or
(b) $R^8_2HSiO(R^8_2SiO)_\gamma(R^8HSiO)_\eta SiR^8_2H$,
(c) a combination thereof.

In formula (a), $\epsilon$ has an average value of 0 to 2000, and $\phi$ has an average value of 2 to 2000. Each $R^7$ is independently a monovalent organic group free of aliphatic unsaturation. Suitable monovalent organic groups free of aliphatic unsaturation include alkyl groups such as methyl, ethyl, propyl, and butyl; aromatic groups such as phenyl, tolyl, and xylyl; and cyano-functional groups exemplified by cyanoalkyl groups such as cyanoethyl and cyanopropyl.

In formula (b), $\gamma$ has an average value of 0 to 2000, and $\eta$ has an average value of 0 to 2000. Each $R^8$ is independently a monovalent organic group free of aliphatic unsaturation. Suitable monovalent organic groups free of aliphatic unsaturation include alkyl groups such as methyl, ethyl, propyl, and butyl; aromatic groups such as phenyl, tolyl, and xylyl; and cyano-functional groups exemplified by cyanoalkyl groups such as cyanoethyl and cyanopropyl.

Component (II) is exemplified by
i) dimethylhydrogensiloxy-terminated polydimethylsiloxane,
ii) dimethylhydrogensiloxy-terminated poly(dimethylsiloxane/methylhydrogensiloxane),
iii) dimethylhydrogensiloxy-terminated polymethylhydrogensiloxane,
iv) trimethylsiloxy-terminated poly(dimethylsiloxane/methylhydrogensiloxane),
v) trimethylsiloxy-terminated polymethylhydrogensiloxane,
vi) a resin consisting essentially of $H(CH_3)_2SiO_{1/2}$ units and $SiO_{4/2}$ units, and
vii) combinations thereof.

Component (II) can be a combination of two or more organohydrogenpolysiloxanes that differ in at least one of the following properties: structure, average molecular weight, viscosity, siloxane units, and sequence.

Methods of preparing linear, branched, and cyclic organohydrogenpolysiloxanes suitable for use as component (II), such as hydrolysis and condensation of organohalosilanes, are well known in the art. Methods of preparing organohydrogenpolysiloxane resins suitable for use as component (II) are also well known as exemplified in U.S. Pat. Nos. 5,310,843; 4,370,358; and 4,707,531.

The molar ratio of silicon-bonded hydrogen atoms in component (B) to aliphatically unsaturated groups in component (A) ($SiH_B/Vi_A$) is not critical.

Component (III) Hydrosilylation Catalyst

Component (III) is a hydrosilylation catalyst. Component (III) is added to the composition in an amount of 0.1 to 1000 ppm of platinum group metal, alternatively 1 to 500 ppm, alternatively 2 to 200, alternatively 5 to 150 ppm, based on the weight of the composition. Suitable hydrosilylation catalysts are known in the art and commercially available. Component (III) may comprise a platinum group metal selected from platinum, rhodium, ruthenium, palladium, osmium or iridium metal or organometallic compound thereof, or a combination thereof. Component (III) is exemplified by compounds such as chloroplatinic acid, chloroplatinic acid hexahydrate, platinum dichloride, and complexes of said compounds with low molecular weight organopolysiloxanes or platinum compounds microencapsulated in a matrix or coreshell type structure. Complexes of platinum with low molecular weight organopolysiloxanes include 1,3-diethenyl-1,1,3,3-tetramethyldisiloxane complexes with platinum. These complexes may be microencapsulated in a resin matrix.

Suitable hydrosilylation catalysts for component (III) are described in, for example, U.S. Pat. Nos. 3,159,601; 3,220, 972; 3,296,291; 3,419,593; 3,516,946; 3,814,730; 3,989, 668; 4,784,879; 5,036,117; and 5,175,325 and EP 0 347 895 B. Microencapsulated hydrosilylation catalysts and methods of preparing them are known in the art, as exemplified in U.S. Pat. No. 4,766,176 and the references cited therein; and U.S. Pat. No. 5,017,654.

Component (IV) Fluoroorganosilicone

Component (IV) is a fluoroorganosilicone having at least one functional group reactive with component (I), component (II), or both. The viscosity of component (IV) is not specifically restricted, however, component (IV) may have a viscosity of 0.0001 to 500 Pa·s at 25° C.

Component (IV) may comprise a compound of the formula:
(a) $R^9_3SiO(R^9_2SiO)_\iota(R^9R^{10}SiO)_\phi SiR^9_3$,
(b) $R^{11}_2R^{12}SiO(R^{11}_2SiO)_\kappa(R^{11}R^{12}SiO)_\lambda SiR^{11}_2R^{12}$,
(c) $F_3C(CF_2)_\nu R^{13}-Si-[O-Si(R^{14})_2(R^{15})]_3$,
(d) a resinous or branched structure consisting essentially of $R^{15}R^{14}_2SiO_{1/2}$ units, $CF_3(CF_2)_\nu R^{13}SiO_{3/2}$ units, and optionally $SiO_{4/2}$ units, or
(e) a combination thereof.

In formula (a) $\iota$ has an average value of 0 to 2000, and $\phi$ has an average value of 1 to 500. Each $R^9$ is independently a hydrogen atom or a monovalent organic group. Suitable monovalent organic groups include monovalent hydrocarbon groups that are free of aliphatic unsaturation such as alkyl groups such as methyl, ethyl, propyl, and butyl; aromatic groups such as phenyl, tolyl, and xylyl; and cyano-functional groups exemplified by cyanoalkyl groups such as cyanoethyl and cyanopropyl. Suitable monovalent organic groups also include unsaturated monovalent organic groups exemplified by acrylate functional groups; methacrylate functional groups; alkenyl groups such as vinyl, allyl, and butenyl; and alkynyl groups such as ethynyl, propynyl, and butynyl. In formula (a) at least one $R^9$ is a hydrogen atom or an unsaturated monovalent organic group. Each $R^{10}$ is independently a fluoro-functional organic group. Suitable fluoro-functional organic groups include, but are not limited to, fluorinated alkyl groups such as 3,3,3-trifluoropropyl, 4,4,4,3,3-pentafluorobutyl, 5,5,5,4,4,3,3-heptafluoropentyl, and 6,6,6,5,5,4,4,3,3-nonafluorohexyl.

In formula (b) $\kappa$ has an average value of 0 to 2000, and $\lambda$ has an average value of 0 to 500. Each $R^{11}$ is independently a hydrogen atom or a monovalent organic group. Suitable monovalent organic groups include cyano-functional groups exemplified by cyanoalkyl groups such as cyanoethyl and cyanopropyl; and monovalent hydrocarbon groups free of aliphatic unsaturation, exemplified by alkyl groups such as methyl, ethyl, propyl, and butyl; and aromatic groups such as phenyl, tolyl, and xylyl. Suitable monovalent organic groups also include unsaturated monovalent organic groups exemplified by acrylate functional groups; methacrylate functional groups; alkenyl groups such as vinyl, allyl, and butenyl; and alkynyl groups such as ethynyl, propynyl, and butynyl. In formula (b) at least one $R^{11}$ is a hydrogen atom or an unsaturated monovalent organic group. Each $R^{12}$ is independently a fluoro-functional organic group. Suitable fluoro-functional organic groups include fluorinated alkyl groups such as 3,3,3-trifluoropropyl, 4,4,4,3,3-pentafluorobutyl, 5,5,5,4,4,3,3-heptafluoropentyl, and 6,6,6,5,5,4,4,3,3-nonafluorohexyl.

In formulae (c) and (d), v is 0 to 10. Each $R^{13}$ is independently a divalent organic group such as a divalent hydrocarbon group. Suitable divalent organic groups for $R^{13}$ may have at least 2 carbon atoms, alternatively, 2 to 20 carbon atoms, alternatively 2 to 10 carbon atoms. Examples of suitable divalent hydrocarbon groups for $R^{13}$ include alkylene groups such as methylene, ethylene, propylene, and butylene. Each $R^{14}$ is independently a monovalent hydrocarbon group free of aliphatic unsaturation. $R^{14}$ is exemplified by alkyl such as methyl, ethyl, propyl, pentyl, octyl, undecyl, and octadecyl; cycloalkyl such as cyclohexyl; and aryl such as phenyl, tolyl, xylyl, benzyl, and 2-phenylethyl. Each $R^{15}$ is independently a hydrogen atom or an aliphatically unsaturated hydrocarbon group exemplified by alkenyl such as vinyl, allyl, butenyl, and hexenyl; and alkynyl such as ethynyl, propynyl, and butynyl. If one $R^{15}$ is an aliphatically unsaturated hydrocarbon group, then all $R^{15}$ in the molecule may be the same or different aliphatically unsaturated hydrocarbon group. If one $R^{15}$ in a molecule is a hydrogen atom, then all $R^{15}$ may be hydrogen atoms.

Component (IV) is exemplified by
i) dimethylvinylsiloxy-terminated polymethyl3,3,3-trifluoropropyl siloxane,
ii) dimethylvinylsiloxy-terminated poly(methylhydrogensiloxane/methyl-6,6,6,5,5,4,4,3,3-nonafluorohexylsiloxane),
iii) trimethylsiloxy-terminated poly(methylhydrogensiloxane/methyl-6,6,6,5,5,4,4,3,3-nonafluorohexylsiloxane),
iv) trimethylsiloxy-terminated poly(methylhydrogensiloxane/methyl-6,6,6,5,5,4,4,3,3-nonafluorohexylsiloxane), and
v) combinations thereof.

Component (IV) is added to the composition in an amount of 0.01 to 100 parts by weight based on the weight of component (I). As the optimal overall composition depends upon the specific properties desired such as viscosity, modulus, or cure speed, the optimal level of component (IV) may vary accordingly. Without wishing to be bound by theory, it is thought that the halogenated portion of component (IV) migrates to the surface of the composition when cured. It is thought that sufficient chemical resistance for many applications can be obtained without adding a higher amount of component (IV), which would dramatically increase the cost of the composition. Without wishing to be bound by theory, it is thought that component (IV) also facilitates migration of component (V) to the surface of the composition and to other interfaces, further increasing chemical resistance and improving adhesion. Component (IV) may be a combination of two or more fluoroorganosilicones that differ in at least one of the following properties: structure, average molecular weight, viscosity, siloxane units, and sequence.

Fluoroorganosilicones suitable for use as component (IV) are known in the art. Fluoroorganosilicones may be prepared by those methods disclosed above for components (I) and (II), by varying appropriate starting materials. One skilled in the art would be able to manufacture suitable fluoroorganosilicones for component (IV) without undue experimentation.

Component (V) Unsaturated Ester-Functional Compound

Component (V) is an unsaturated ester-functional compound, i.e., an organic compound having at least one ester group per molecule and at least one unsaturated group per molecule capable of undergoing hydrosilylation. Component (V) may comprise:

i)

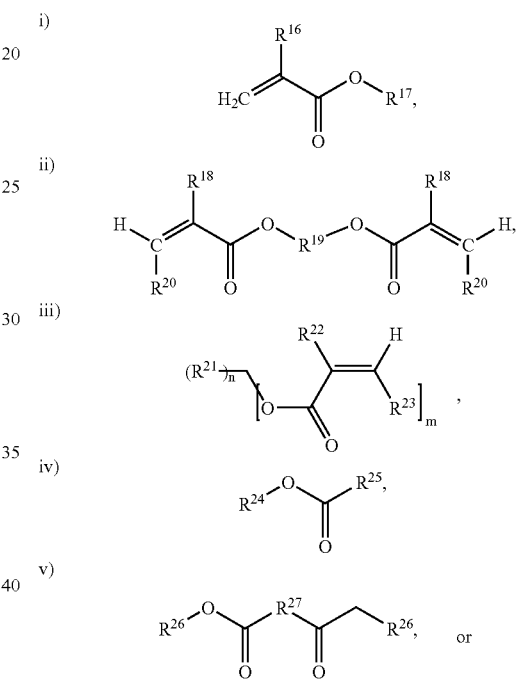

ii)

iii)

iv)

v)

vi) a combination thereof.

In formula i), each $R^{16}$ is independently a hydrogen atom, a monovalent hydrocarbon group of 1 to 4 carbon atoms, or $CF_3$. Examples of monovalent hydrocarbon groups for $R^{16}$ include alkyl groups such as methyl, ethyl, propyl, and butyl. Each $R^{17}$ is independently a hydrogen atom, a monovalent organic group, with the proviso that not all $R^{17}$ are hydrogen atoms, or a metal ion. Examples of monovalent organic groups for $R^{17}$ include monovalent hydrocarbon groups, fluoroalkyl groups, epoxy functional groups, and polyether groups. Examples of monovalent hydrocarbon groups include, but are not limited to, alkyl such as methyl, ethyl, propyl, pentyl, octyl, undecyl, dodecyl, and octadecyl; cycloalkyl such as cyclohexyl; alkenyl such as vinyl, allyl, butenyl, and hexenyl; alkynyl such as ethynyl, propynyl, and butynyl; and aryl such as phenyl, tolyl, xylyl, benzyl, and 2-phenylethyl. Examples of epoxy-functional groups for $R^{17}$ include 3-glycidoxypropyl. Examples of fluoroalkyl groups for $R^{17}$ include but are not limited to $-(CH_2)_x(CF_2)_yCF_3$ where x has an average value of 0 to 20 and y has an average value of 0 to 20, branched fluoroalkyl groups such as perfluoro t-butyl, and cyclic fluoroalkyl groups such as perfluorocyclohexyl, and fluoroaryl groups such as perfluorophenyl. Examples of polyether groups for $R^{17}$ include, but are not limited to, —(CH$_2$CH$_2$O)$_z$CH$_2$CH$_3$, —(CH(CH$_3$)CH$_2$O)$_z$CH(CH$_3$)CH$_3$, —(CH2CH$_2$O)$_z$CH$_2$CH=CH$_2$, —(CH(CH$_3$)CH$_2$O)$_z$CH$_2$CH=CH$_2$, —(CH$_2$CH$_2$CH$_2$CH$_2$O)$_z$CH$_2$CH$_3$, —(CH$_2$CH$_2$CH$_2$CH$_2$O)$_z$CH=CH$_2$, —(CH$_2$CH$_2$O)$_z$CH$_2$CH$_2$OH, —(CH(CH$_3$)CH$_2$O)$_z$CH(CH$_3$)CH$_2$—OH, —(CH$_2$CH$_2$O)$_z$CH$_2$CH$_2$OCH$_3$, and —(CH(CH$_3$)CH$_2$O)$_z$CH(CH$_3$)CH$_2$—OCH$_3$ where z has an average value of 1 to 20, and cyclic ethers such as tetrahydrofurfuryl and 2-(caprolactone)ethyl. Examples of fluoropolyether groups for $R^{17}$ include, but are not limited to, —(CF$_2$—CF$_2$—O)$_z$H, —(CF(CF$_3$)CF$_2$O)$_z$H, —(CF$_2$CF$_2$O)$_z$CF$_3$, —(CF(CF$_3$)CF$_2$O)$_z$CF$_3$, where z is as defined above, —(CH$_2$)$_i$(CF(CF$_3$))$_j$—(O—CF(CF$_3$)$_k$—F where i has an average value of 0 to 10, j has an average value of 0 to 10 and k has an average value of 1 to 20. Examples of metal ions for $R^{17}$ include, but are not limited to, positive ions such as Zn, Al, Ca, Na, Mg and K.

In formula ii), each $R^{18}$ is independently a hydrogen atom, a monovalent hydrocarbon group of 1 to 4 carbon atoms, or CF$_3$. Examples of monovalent hydrocarbon groups for $R^{18}$ include alkyl such as methyl, ethyl, propyl, and butyl. Each $R^{19}$ is independently a divalent organic group of 1 to 20 carbon atoms. Examples of divalent organic groups for $R^{19}$ include, but are not limited to, alkylene such as methylene, ethylene, propylene, pentylene, neo-pentylene, octylene, undecylene, and octadecylene; cycloalkylene such as cylcohexylene; alkenylene such as vinylene, allylene, butenylene, and hexenylene; alkynylene such as ethynylene, propynylene, and butynylene; arylene such as phenylene, tolylene, xylylene, benzylene, and 2-phenylethylene; ether diol derivatives such as —(CH$_2$CH$_2$O)$_z$—CH$_2$CH$_2$— and —(CH(CH$_3$)CH$_2$O)$_z$—CH(CH$_3$)CH$_2$ where z is as defined above for $R^{19}$; alkylene/arylene combinations such as 4,4'-isopropylidene diphenyl (also known as Bisphenol "A"). Examples of divalent fluorinated organic groups for $R^{19}$ include, but are not limited to, —(CH$_2$)$_x$(CH(F))$_y$(CF$_2$)$_z$—, —(CF$_2$CF$_2$O)$_z$—, —(CF(CF$_3$)CF$_2$O)$_z$— where x, y, and z are as defined above, perfluorocyclohexyl-1,4-dimethyl, and 4,4'-hexafluoroisopropylidene diphenyl (derived from hexafluoro Bisphenol "A"). Each $R^{20}$ is independently a hydrogen atom or a monovalent hydrocarbon group of 1 to 20 carbon atoms. Examples of monovalent hydrocarbon groups for $R^{20}$ include, but are not limited to, alkyl such as methyl, ethyl, propyl, pentyl, octyl, undecyl, and octadecyl; cycloalkyl such as cyclohexyl; alkenyl such as vinyl, allyl, butenyl, and hexenyl; alkynyl such as ethynyl, propynyl, and butynyl; and aryl such as phenyl, tolyl, xylyl, benzyl, and 2-phenylethyl.

In formula iii), n has an average value of 0 to 3 and m=4−n. Each $R^{21}$ is independently a hydrogen atom, a monovalent hydrocarbon group of 1 to 20 carbon atoms, a hydroxyl group, or CF$^3$. Examples of monovalent hydrocarbon groups for $R^{21}$ include, but are not limited to, alkyl such as methyl, ethyl, propyl, pentyl, octyl, undecyl, and octadecyl; cycloalkyl such as cyclohexyl; alkenyl such as vinyl, allyl, butenyl, and hexenyl; alkynyl such as ethynyl, propynyl, and butynyl; and aryl such as phenyl, tolyl, xylyl, benzyl, and 2-phenylethyl.

Each $R^{22}$ is independently a hydrogen atom, a monovalent hydrocarbon group of 1 to 4 carbon atoms, or CF$^3$. Examples of monovalent hydrocarbon groups for $R^{22}$ include, but are not limited to, alkyl such as methyl, ethyl, propyl, pentyl, octyl, undecyl, and octadecyl; cycloalkyl such as cyclohexyl; alkenyl such as vinyl, allyl, butenyl, and hexenyl; alkynyl such as ethynyl, propynyl, and butynyl; and aryl such as phenyl, tolyl, xylyl, benzyl, and 2-phenylethyl.

Each $R^{23}$ is independently a hydrogen atom or a monovalent hydrocarbon group of 1 to 20 carbon atoms. Examples of monovalent hydrocarbon groups for $R^{23}$ include, but are not limited to, alkyl such as methyl, ethyl, propyl, pentyl, octyl, undecyl, and octadecyl; cycloalkyl such as cyclohexyl; alkenyl such as vinyl, allyl, butenyl, and hexenyl; alkynyl such as ethynyl, propynyl, and butynyl; and aryl such as phenyl, tolyl, xylyl, benzyl, and 2-phenylethyl.

In formula iv), each $R^{24}$ and each $R^{25}$ are independently a monovalent organic group or a hydrogen atom with the proviso that at least one of $R^{24}$ or $R^{25}$ is unsaturated. Examples of monovalent organic groups for $R^{24}$ include monovalent hydrocarbon groups, fluoroalkyl groups, epoxy functional groups, and polyether groups, all exemplified by those listed for $R^{17}$.

Examples of monovalent organic groups for $R^{25}$ include monovalent hydrocarbon groups, fluoroalkyl groups, epoxy functional groups, and polyether groups, all exemplified, but not limited, by those listed for $R^{17}$. Additional examples of monovalent organic groups for $R^{25}$ include oxygen-bridged monovalent organic groups such as —O—C(O)O—(CH$_2$)$_o$CH=CH$_2$ where o has an average value of 0 to 20 and carbon-bridged carbonyl groups such as —CH$_2$—C(O)—CH$_3$.

In formula v), each $R^{26}$ is independently a monovalent organic group or a hydrogen atom, with the proviso that at least one $R^{26}$ is an aliphatically unsaturated monovalent organic group or a hydrogen atom. Examples of monovalent organic groups for $R^{26}$ include monovalent hydrocarbon groups, fluoroalkyl groups, epoxy functional groups, and polyether groups, all exemplified by those listed for $R^{17}$.

Each $R^{27}$ is independently an oxygen atom or a divalent organic group. Examples of divalent organic groups for $R^{27}$ include divalent hydrocarbon groups, fluoroalkylene groups, epoxy functional groups, and polyether groups, all exemplified, but not limited, by those listed for $R^{19}$.

Component (V) is exemplified by 2-ethylhexylacrylate, 2-ethylhexylmethacrylate, methylacrylate, methylmethacrylate, neopentylglycol diacrylate, neopentylglycoldimethacrylate, glycidyl acrylate, glycidyl methacrylate, allyl acrylate, allyl methacrylate strearyl acrylate, tetrahydrofurfuryl methacrylate, caprolactone acrylate perfluorobutyl acrylate, perfluorobutyl methacrylate, tetrahydroperfluoroacrylate, phenoxyethyl acrylate, phenoxyethyl methacrylate, Bisphenol "A" acrylate, Bisphenol "A" dimethacrylate, ethoxylated Bisphenol "A" acrylate, ethoxylated Bisphenol "A" methacrylate, hexafluoro Bisphenol "A" diacrylate, hexafluoro Bisphenol "A" dimethacrylate, diethyleneglycol diacrylate, diethyleneglycol dimethacrylate, dipropyleneglycol diacrylate, dipropyleneglycol dimethacrylate, polyethyleneglycol diacrylate, polyethyleneglycol dimethacrylate, polypropyleneglycol diacrylate, polypropyleneglycol dimethacrylate, trimethylolpropanetriacrylate, trimethylolpropanetrimethacrylate, ethoxylated trimethylolpropanetriacrylate, ethoxylated trimethylolpropanetrimethacrylate), pentaerythritol triacrylate, pentaerythritol trimethacrylate), pentaerythritol tetraacrylate, pentaerythritol tetramethacrylate, methyl-3-butenoate, allyl methyl carbonate, diallyl pyrocarbonate, allyl acetoacetate, diallyl carbonate, diallyl phthalate, dimethyl itaconate, diallyl carbonate, or a combination thereof.

Component (V) is added to the composition in an amount of 0.01 to 50 weight parts based on the weight of the composition. Without wishing to be bound by theory, it is thought that component (V) improves both chemical resistance and the adhesive property of the cured product of the composition.

Unsaturated ester-functional compounds suitable for component (V) are known in the art and commercially available from, for example, Sartomer Company and Aldrich Chemical Company. One skilled in the art would be able to obtain unsaturated ester-functional compounds without undue experimentation.

Component (VI) Adhesion Promoter

Component (VI) is an adhesion promoter. Component (VI) is added to the composition in an amount of 0.01 to 50 weight parts based on the weight of the composition.

Component (VI) may comprise a transition metal chelate, an alkoxysilane, a combination of an alkoxysilane and a hydroxy-functional polyorganosiloxane, or a combination thereof.

Component (VI) can be an unsaturated or epoxy-functional compound. Suitable epoxy-functional compounds are known in the art and commercially available, see for example, U.S. Pat. Nos. 4,087,585; 5,194,649; 5,248,715; and 5,744,507 col. 4–5. Component (VI) may comprise an unsaturated or epoxy-functional alkoxysilane. For example, the functional alkoxysilane can have the formula $R^{28}_\mu Si(OR^{29})_{(4-\mu)}$, where $\mu$ is 1, 2, or 3, alternatively $\mu$ is 1.

Each $R^{28}$ is independently a monovalent organic group with the proviso that at least one $R^{28}$ is an unsaturated organic group or an epoxy-functional organic group. Epoxy-functional organic groups for $R^{28}$ are exemplified by 3-glycidoxypropyl and (epoxycyclohexyl)ethyl. Unsaturated organic groups for $R^{28}$ are exemplified by 3-methacryloyloxypropyl, 3-acryloyloxypropyl, and unsaturated monovalent hydrocarbon groups such as vinyl, allyl, hexenyl, undecylenyl.

Each $R^{29}$ is independently an unsubstituted, saturated hydrocarbon group of at least 1 carbon atom. $R^{29}$ may have up to 4 carbon atoms, alternatively up to 2 carbon atoms. $R^{29}$ is exemplified by methyl, ethyl, propyl, and butyl.

Examples of suitable epoxy-functional alkoxysilanes include 3-glycidoxypropyltrimethoxysilane, 3-glycidoxypropyltriethoxysilane, (epoxycyclohexyl)ethyldimethoxysilane, (epoxycyclohexyl)ethyldiethoxysilane and combinations thereof. Examples of suitable unsaturated alkoxysilanes include vinyltrimethoxysilane, allyltrimethoxysilane, allyltriethoxysilane, hexenyltrimethoxysilane, undecylenyltrimethoxysilane, 3-methacryloyloxypropyl trimethoxysilane, 3-methacryloyloxypropyl triethoxysilane, 3-acryloyloxypropyl trimethoxysilane, 3-acryloyloxypropyl triethoxysilane, and combinations thereof.

Component (VI) may comprise an epoxy-functional siloxane such as a reaction product of a hydroxy-terminated polyorganosiloxane with an epoxy-functional alkoxysilane, as described above, or a physical blend of the hydroxy-terminated polyorganosiloxane with the epoxy-functional alkoxysilane. Component (VI) may comprise a combination of an epoxy-functional alkoxysilane and an epoxy-functional siloxane. For example, component (VI) is exemplified by a mixture of 3-glycidoxypropyltrimethoxysilane and a reaction product of hydroxy-terminated methylvinylsiloxane with 3-glycidoxypropyltrimethoxysilane, or a mixture of 3-glycidoxypropyltrimethoxysilane and a hydroxy-terminated methylvinylsiloxane, or a mixture of 3-glycidoxypropyltrimethoxysilane and a hydroxy-terminated methyvinyl/dimethylsiloxane copolymer. When used as a physical blend rather than as a reaction product, these components may be stored separately in multiple-part kits.

Suitable transition metal chelates include titanates, zirconates such as zirconium acetylacetonate, aluminum chelates such as aluminum acetylacetonate, and combinations thereof. Transition metal chelates and methods for their preparation are known in the art, see for example, U.S. Pat. No. 5,248,715, EP 0 493 791 A1, and EP 0 497 349 B1.

Optional Components

An optional component may be added to the composition in addition to components (I)–(VI). Suitable optional components include (VII) a void reducing agent, (VIII) a pigment, (IX) a filler, (X) a cure modifier, (XI) a rheology modifier, (XII) a spacer, and combinations thereof.

Component (VII) Void Reducing Agent

Component (VII) is a void reducing agent. Component (VII) is added to the composition in an amount sufficient to reduce voids. Suitable void reducing agents are known in the art and commercially available, see for example, EP 0 850 997 A2 and U.S. Pat. Nos. 4,273,902 and 5,684,060. Suitable void reducing agents can comprise zeolites, anhydrous aluminum sulfate, molecular sieves (preferably with a pore diameter of 10 Å or less), kieselguhr, silica gel, activated carbon, palladium compounds such as palladium metal, palladium metal supported on a substrate exemplified by carbon or alumina, and organopalladium compounds.

Component (VIII) Pigment

Component (VIII) is a pigment. The amount of component (VIII) added to the composition depends on the type of pigment selected. Component (VIII) may be added to the composition in an amount of 0.001% to 30% based on the weight of the composition. Pigments are known in the art and commercially available. Suitable pigments include carbon blacks, such as LB-1011C carbon black from Williams, chromium oxide pigments, such as Harcros G-6099, titanium dioxides such as those available from DuPont, and UV-active dyes such as (thiophenediyl)bis(t-butylbenzoxazole) which is commercially available under the name UVITEX OB from Ciba Specialty Chemicals.

Component (IX) Filler

Component (IX) is a filler. The amount of component (IX) added to the composition depends on the type of filler selected. Component (IX) may be added to the composition in an amount of 0.1% to 90% based on the weight of the compositions. Suitable fillers include reinforcing fillers such silica, titania, and combinations thereof. Suitable reinforcing fillers are known in the art and commercially available, such as a ground silica sold under the name MIN-U-SIL by U.S. Silica of Berkeley Springs, W. Va. or fumed silica sold under the name CAB-O-SIL by Cabot Corporation of Massachusetts.

Conductive fillers (i.e., fillers that are thermally conductive, electrically conductive, or both) may also be used as component (IX). Suitable conductive fillers include metal particles, metal oxide particles, and a combination thereof. Suitable thermally conductive fillers are exemplified by aluminum nitride; aluminum oxide; barium titinate; beryllium oxide; boron nitride; diamond; graphite; magnesium oxide; metal particulate such as copper, gold, nickel, or silver; silicon carbide; tungsten carbide; zinc oxide, and a combination thereof.

Conductive fillers are known in the art and commercially available, see for example, U.S. Pat. No, 6,169,142 (col. 4, lines 7–33). For example, CB-A20S and Al-43-Me are aluminum oxide fillers of differing particle sizes commercially available from Showa-Denko, and AA-04, AA-2, and AA18 are aluminum oxide fillers commercially available from Sumitomo Chemical Company. Silver filler is commercially available from Metalor Technologies U.S.A. Corp. of Attleboro, Mass., U.S.A. Boron nitride filler is commercially available from Advanced Ceramics Corporation, Cleveland, Ohio, U.S.A.

The shape of the conductive filler particles is not specifically restricted, however, rounded or spherical particles may prevent viscosity increase to an undesirable level upon high loading of the thermally conductive filler in the composition.

A combination of thermally conductive fillers having differing particle sizes and different particle size distributions may be used. For example, it may be desirable to combine a first conductive filler having a larger average particle size with a second conductive filler having a smaller average particle size in a proportion meeting the closest packing theory distribution curve. This improves packing efficiency and may reduce viscosity and enhance heat transfer.

The thermally conductive filler may optionally be surface treated with a treating agent. Treating agents and treating methods are known in the art, see for example, U.S. Pat. No. 6,169,142 (col. 4, line 42 to col. 5, line 2). The thermally conductive filler may be treated with the treating agent prior to combining the thermally conductive filler with the other components of the composition, or the thermally conductive filler may be treated in situ.

The treating agent can be an alkoxysilane having the formula: $R^{30}{}_p Si(OR^{31})_{(4-p)}$, where p is 1, 2, or 3; alternatively p is 3. $R^{30}$ is a substituted or unsubstituted monovalent hydrocarbon group of at least 1 carbon atom, alternatively at least 8 carbon atoms. $R^{30}$ has up to 50 carbon atoms, alternatively up to 30 carbon atoms, alternatively up to 18 carbon atoms. $R^{30}$ is exemplified by alkyl groups such as hexyl, octyl, dodecyl, tetradecyl, hexadecyl, and octadecyl; and aromatic groups such as benzyl, phenyl and phenylethyl. $R^{30}$ can be saturated or unsaturated, branched or unbranched, and unsubstituted. $R^{30}$ can be saturated, unbranched, and unsubstituted.

$R^{31}$ is an unsubstituted, saturated hydrocarbon group of at least 1 carbon atom. $R^{31}$ may have up to 4 carbon atoms, alternatively up to 2 carbon atoms. The treating agent is exemplified by hexyltrimethoxysilane, octyltriethoxysilane, decyltrimethoxysilane, dodecyltrimethoxysilane, tetradecyltrimethoxysilane, phenyltrimethoxysilane, phenylethyltrimethoxysilane, octadecyltrimethoxysilane, octadecyltriethoxysilane, and a combination thereof.

Alkoxy-functional oligosiloxanes can also be used as treatment agents. Alkoxy-functional oligosiloxanes and methods for their preparation are known in the art, see for example, EP 1 101 167 A2. For example, suitable alkoxy-functional oligosiloxanes include those of the formula $(R^{32}O)_d Si(OSiR^{33}{}_2 R^{34})_{4-d}$. In this formula, d is 1, 2, or 3, alternatively d is 3. Each $R^{32}$ can be an alkyl group. Each $R^{33}$ can be independently selected from saturated and unsaturated monovalent hydrocarbon groups of 1 to 10 carbon atoms. Each $R^{34}$ can be a saturated or unsaturated monovalent hydrocarbon group having at least 11 carbon atoms.

Metal fillers can be treated with alkylthiols such as octadecyl mercaptan and others, and fatty acids such as oleic acid, stearic acid, titanates, titanate coupling agents, zirconate coupling agents, and a combination thereof.

Treatment agents for alumina or passivated aluminum nitride could include alkoxysilyl functional alkylmethyl polysiloxanes (e.g., partial hydrolysis condensate of $R^{35}{}_b R^{36}{}_c Si(OR^{37})_{(4-b-c)}$ or cohydrolysis condensates or mixtures), similar materials where the hydrolyzable group would be silazane, acyloxy or oximo. In all of these, a group tethered to Si, such as $R^{35}$ in the formula above, is a long chain unsaturated monovalent hydrocarbon or monovalent aromatic-functional hydrocarbon. $R^{36}$ is a monovalent hydrocarbon group, and $R^{37}$ is a monovalent hydrocarbon group of 1 to 4 carbon atoms. In the formula above, b is 1, 2, or 3 and c is 0, 1, or 2, with the proviso that b+c is 1, 2, or 3. One skilled in the art could optimize a specific treatment to aid dispersion of the filler without undue experimentation.

Component (X) Cure Modifier

Component (X) is a cure modifier. Component (X) can be added to extend the shelf life or working time, or both, of the composition of this invention. Component (X) can be added to raise the curing temperature of the composition. Suitable cure modifiers are known in the art and are commercially available. Component (X) is exemplified by acetylenic alcohols such as methyl butynol, ethynyl cyclohexanol, dimethyl hexynol, and combinations thereof; cycloalkenylsiloxanes such as methylvinylcyclosiloxanes exemplified by 1,3,5,7-tetramethyl-1,3,5,7-tetravinylcyclotetrasiloxane, 1,3,5,7-tetramethyl-1,3,5,7-tetrahexenylcyclotetrasiloxane, and combinations thereof; ene-yne compounds such as 3-methyl-3-penten-1-yne, 3,5-dimethyl-3-hexen-1-yne; triazoles such as benzotriazole; phosphines; mercaptans; hydrazines; amines such as tetramethyl ethylenediamine, dialkyl fumarates, dialkenyl fumarates, dialkoxyalkyl fumarates, maleates, and combinations thereof.

Suitable cure modifiers are disclosed by, for example, U.S. Pat. Nos. 3,445,420; 3,989,667; 4,584,361; and 5,036,117.

The amount of component (X) added to the composition will depend on the particular cure modifier used, the nature and amount of component (III), and the composition of component (II). However, the amount of component (X) may be 0.001% to 10% based on the weight of the composition.

Component (XI) Rheology Modifier

Component (XI) is a rheology modifier. Rheology modifiers can be added to change the thixotropic properties of the composition. Component (XI) is exemplified by flow control additives; reactive diluents; anti-settling agents; alpha-olefins; hydroxyl-terminated silicone-organic copolymers, including but not limited to hydroxyl-terminated polypropyleneoxide-dimethylsiloxane copolymers; and combinations thereof.

Component (XII) Spacer

Component (XII) is a spacer. Spacers can comprise organic particles, inorganic particles, or a combination thereof. Spacers can be thermally conductive, electrically conductive, or both. Spacers can have a particle size of 25 micrometers to 250 micrometers. Spacers can comprise monodisperse beads. The amount of component (XII) depends on various factors including the distribution of particles, pressure to be applied during placement of the composition, temperature of placement, and others. The composition can contain up to 15%, alternatively up to 5% of component (XII) added in addition to, or instead of, a portion of component (IX).

Other Optional Components

Other optional components may be added in addition to, or instead of, all or a portion of those described above, provided the optional component does not prevent the composition from curing to form a silicone product having improved adhesion and chemical resistance, as described above. Examples of other optional components include, but are not limited to, acid acceptors; anti-oxidants; stabilizers such as magnesium oxide, calcium hydroxide, metal salt additives such as those disclosed in EP 0 950 685 A1, heat stabilizers, and ultra-violet (UV) stabilizers; flame retardants; silylating agents, such as 4-(trimethylsilyloxy)-3-penten-2-one and N-(t-butyl dimethylsilyl)-N-methyltrifluoroacetamide; desiccants, such as zeolites, anhydrous aluminum sulfate, molecular sieves (preferably with a pore diameter of 10 Å or less), kieselguhr, silica gel, and activated carbon; and blowing agents, such as water, methanol, ethanol, iso-propyl alcohol, benzyl alcohol, 1,4 butanediol, 1,5 pentanediol, 1,7 heptanediol, and silanols.

Overall SiH:Vi Ratio

The components in the composition may be selected such that the molar ratio of the total amount of silicon-bonded hydrogen atoms to aliphatically unsaturated groups in the composition ($SiH_{tot}/Vi_{tot}$) is greater than 0.9, alternatively at least 1.0, and alternatively at least 1.05. $SiH_{tot}/Vi_{tot}$ may be up to 10.0, alternatively up to 5.0, and alternatively up to 3.0. Without wishing to be bound by theory, it is thought that if $SiH_{tot}/Vi_{tot}$ is too low, then the composition may not cure or may not adhere to some substrates. Without wishing to be bound by theory, it is thought that if $SiH_{tot}/Vi_{tot}$ is too high, surface properties such as adhesion may be hindered and there may be an increase in Bleed from within the formulation to other surfaces.

Kits

The composition may be a one-part composition or a multiple-part composition such as a two-part composition. In a multiple-part composition, components (II) and (III) are stored in separate parts. Any of components (I) and (IV)–(XI) can be added to either or both parts. One skilled in the art would know how to select components for each part without undue experimentation.

When a multiple part composition is prepared, it may be marketed as a kit. The kit may further comprise information or instructions or both as how to use the kit, how to combine the parts, or how to cure the resulting combination, or combinations thereof. For example, a kit comprising Part A and Part B can be prepared as follows.

Part A comprises:
(I) a polyorganosiloxane having at least two terminally-unsaturated organic groups per molecule,
(III) a hydrosilylation catalyst,
optionally (IV) a haloorganosilicone having at least one functional group reactive with component (I),
optionally (V) an unsaturated ester-functional compound,
optionally (VI) an adhesion promoter,
optionally (VII) a void reducing agent,
optionally (VIII) a pigment,
optionally (IX) a filler,
optionally (X) an cure modifier,
optionally (XI) a rheology modifier, and
optionally (XII) a spacer.

Part B comprises:
optionally (I) a polyorganosiloxane having at least two terminally-unsaturated organic groups per molecule,
(II) an organohydrogenpolysiloxane having at least two silicon-bonded hydrogen atoms per molecule,
optionally (IV) a haloorganosilicone having at least one functional group reactive with component (I), component (II), or both,
optionally (V) an unsaturated ester-functional compound,
optionally (VI) an adhesion promoter,
optionally (VII) a void reducing agent,
optionally (VIII) a pigment,
optionally (IX) a filler,
optionally (X) an cure modifier,
optionally (XI) a rheology modifier, and
optionally (XII) a spacer.

In the kit, at least one of Part A and Part B contains component (IV), and at least one of Part A and Part B contains component (V).

Part A and Part B can be mixed together in a ratio of Part A: Part B (A:B) of 0.05:1 to 20:1, alternatively 0.1:1 to 10:1, alternatively 1:1 to 5:1.

Method of Making the Composition

The compositions described above can be prepared by mixing the components by any convenient means. For example, the composition can be prepared by mixing all components at ambient temperature. When component (X) is present, component (X) may be added before component (III).

The mixer used is not specifically restricted and will be determined by the viscosity of the components and the composition. Suitable mixers include but are not limited to paddle type mixers, kneader type mixers, non-intrusive mixers such as those reliant on centrifugal motion, and two- and three-roll rubber mills. One skilled in the art would be able to prepare the composition without undue experimentation by the methods disclosed above and in the examples set forth below.

Method of Use

The composition of this invention is useful for a range of applications where modified surface or interface properties, or both, are desired. For example, the compositions described above cure to form a part that can be used as an adhesive; protective coating for electronic circuitry, planar surfaces, fibers or small particles; or gasketing materials. Exposed surfaces of the fully cured or partially cured products of this composition may also be useful as substrates for bonding by another adhesive or for secondary bonding to another substrate (as exemplified by a dry film adhesive).

The composition of this invention cures to form a product that can be used as an adhesive. The composition can be cured at ambient or elevated temperature. The composition may be applied to a substrate before or during curing. Exposed surfaces of the fully cured or partially cured products of this invention may also be useful as a substrate for bonding by another adhesive or for secondary bonding to another substrate (as exemplified by a dry film adhesive). The adhesives may be used, for example, as products such as die attach adhesives, as lid seals, gels and encapsulants.

Cured products prepared using the compositions of this invention can vary in properties from rigid resins to elastomers to gels, depending upon the types and concentrations of components (I) and (II) and and any optional components that are added to the composition. Cured products prepared using the compositons are useful in a variety of end-use applications, for example, as coatings or as molded or extruded articles. The compositions can be applied to substrates by spraying, dipping, pouring, screen printing, extrusion or by the use of a brush, roller or coating bar. The selection of a particular application method will be determined at least in part by the viscosity of the curable composition.

Suitable substrates to which the composition, or cured product thereof, may be applied and which are useful in electronics applications include epoxies, polycarbonates, poly(butylene terephthalate) resins, polyamide resins and blends thereof, such as blends of polyamide resins with syndiotactic polystyrene such as those commercially available from the Dow Chemical Company, of Midland, Mich., U.S.A., acrylonitrile-butadiene-styrenes, styrene-modified poly(phenylene oxides), poly(phenylene sulfides), vinyl esters, polyphthalamides, polyimides, silicon, aluminum, stainless steel alloys, titanium, copper, nickel, silver, gold, and combinations thereof.

The composition of this invention can be used, for adhering two surfaces, such as in lid seal applications. For example, the composition can be used for gluing a plastic lid onto a plastic housing for electronic circuitry in an assembly process by a method comprising:
(1) applying the composition described above onto the plastic housing,
(2) placing the lid over the housing such that the edges of the lid are in contact with the composition, and
(3) curing the assembly to form a sealed housing.

Alternatively, the composition can be used, for example, to coat an electronic circuit board, by method comprising:
(1) applying the composition described above over the electronic circuit board, and
(2) curing the composition to produce a sealed circuit board.

Alternatively, the composition can be used, for example, for die attach applications, in a method comprising:
(1) applying the composition described above on an electronic substrate,
(2) attaching a semiconductor die to the composition,
(3) curing the composition to produce a bonded composite.

The method may further comprise one or more optional steps such as (4) repeating steps (1) to (3) to attach one or more additional semiconductor dice to the semiconductor die, (5) wire bonding the semiconductor die or semiconductor dice, (6) cleaning, for example by exposure to plasma, (7) overmolding the semiconductor die or semiconductor dice with a molding compound, and (8) attaching solder balls to form a finished package. In step (1), the electronic substrate may be, for example, a circuit board, a TAB tape, or other substrate known in the art, or the electronic substrate may be a semiconductor die.

FIG. 3 shows an example of a package 300 prepared according to this method. The package 300 includes a semiconductor die 301 bonded to a substrate 302 shown as a polyimide TAB tape flexible circuit through a die attach adhesive 303 prepared from the composition of this invention. The semiconductor die 301 is electrically connected to the substrate 302 through lead bonds 304. The shapes of the lead bonds 304 are dependent on the height of the semiconductor die 301 from the substrate 302. Encapsulant 305 is used to protect the lead bonds 304. FIG. 4 also shows the solder balls 306, which provide the connection mechanism to the substrate (not shown) on which the package 300 will be mounted.

The composition of this invention may be printed or dispensed on the substrate 302. The semiconductor die 301 may then be placed with pressure and heat onto the composition to prepare the die attach adhesive 303.

FIG. 4 shows an example of a package 400 prepared according to this method. The package includes a first semiconductor die 401 stacked on top of a second semiconductor die 402 and attached through a first die attach adhesive 403. The second semiconductor die 402 is mounted to a substrate 404 shown in FIG. 4 as a circuit board through a second die attach adhesive 405. The first die attach adhesive 403 and the second die attach adhesive 405 are prepared by curing the composition of this invention. The first die attach adhesive 403 and the second die attach adhesive 405 may be the same or different.

The package 400 may be assembled, for example, by applying a composition according to this invention to the substrate 404. The second semiconductor die 402 may be heated and placed onto the composition with enough pressure to spread the composition uniformly under the second semiconductor die 402. The heat of the die may partially or fully cure the composition to form the second die attach adhesive 405. A composition according to this invention may then be applied to the top of the second semiconductor die 402 and the first semiconductor die 401 may be applied hot to the composition with sufficient pressure, as described above. The composition partially or fully cures to form the first die attach adhesive 403.

The first semiconductor die 401 is electrically connected to the substrate through bonding wires 406 and the second semiconductor die 402 is electrically connected to the substrate through bonding wires 407. An overmolding 408 may then be applied to protect the semiconductor dice 401, 402 and the bonding wires 406, 407. Solder balls 409 may then be added to the substrate 404.

Figure 1:
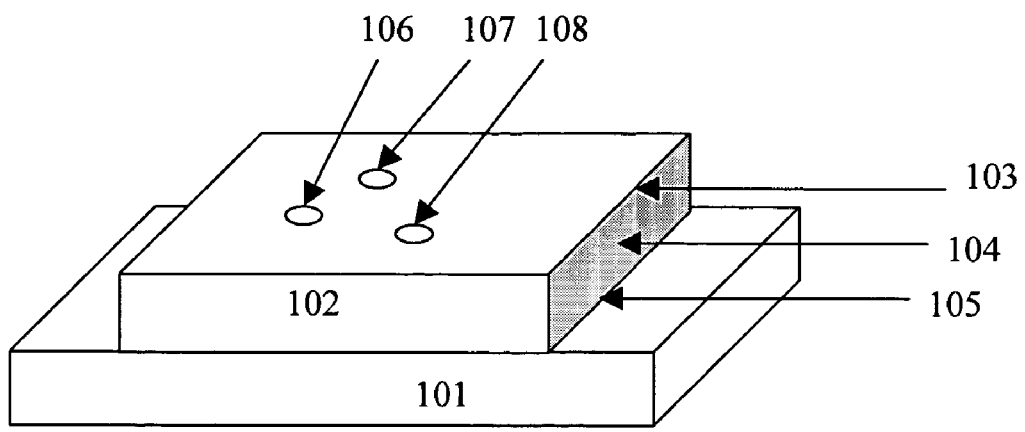
FIG. 1 shows a sample used for determination of interface compositions by surface analysis according to the method described in Reference Example 5.

REFERENCE NUMERALS 101 polycarbonate substrates
102 cured samples
103 free surface
104 bulk
105 substrate interface 106 spot for analysis
107 spot for analysis
108 spot for analysis
300 package
301 semiconductor die
302 substrate
303 die attach adhesive
304 lead bonds
305 encapsulant
306 solder balls
400 package
401 first semiconductor die
402 second semiconductor die
403 first die attach adhesive
404 substrate
405 second die attach adhesive
406 bonding wires
407 bonding wires
408 overmolding
409 solder balls

EXAMPLES

These examples are intended to illustrate the invention to one skilled in the art and should not be interpreted as limiting the scope of the invention set forth in the claims. The following components are used in these examples.

Blend 1 is a mixture of (i) 27 parts of an organopolysiloxane resin consisting essentially of $CH_2=CH(CH_3)_2SiO_{1/2}$ units, $(CH_3)_3SiO_{1/2}$ units, and $SiO_{4/2}$ units, wherein the mole ratio of $CH_2=CH(CH_3)_2SiO_{1/2}$ units and $(CH_3)_3SiO_{1/2}$ units combined to $SiO_{4/2}$ units is 0.7, and the resin has weight-average molecular weight of 22,000, a polydispersity of 5, and contains 1.8% by weight (5.5 mole %) of vinyl groups, (ii) 71 parts of a dimethylvinylsiloxy-terminated polydimethylsiloxane having a viscosity of 55 Pa·s at 25° C., (iii) 0.1 part ethyl benzene, (iv) 0.4 part xylene, (v) 0.5 part tetra(trimethylsiloxy)silane, and (vi) 0.7 part dimethyl cyclosiloxanes.

PDMS 1 is dimethylvinyl siloxy-terminated linear polydimethylsiloxane having a viscosity of 450 cP at 25° C.

Catalyst 1 is a mixture of 1% of a platinum(IV) complex of 1,1-diethenyl-1,1,3,3-tetramethyldisiloxane, 92% of dimethylvinylsiloxy-terminated polydimethylsiloxane having a viscosity of 0.45 Pa·s at 25° C., and 7% of tetramethyldivinyldisiloxane.

Adhesion Promoter 1 is a mixture of 46% 3-glycidoxypropyltrimethoxysilane, 40% hydroxy-terminated methylvinylsiloxane, 7% cyclic methylvinylsiloxane, 6% a reaction product of hydroxy terminated methylvinyl siloxane, with 3-glycidoxypropyltrimethoxysilane, and 1% methanol. The mixture has a viscosity of 15 cSt at 25° C.

Void Reducing Agent is palladium on carbon.

Pigment is carbon black from Williams.

Quartz is a ground silica sold under the name MIN-U-SIL 5 by U.S. Silica (Berkeley Springs, W. Va.). The silica has a topsize of 5 μm (98%<5 μm), a median particle size of 1.6 μm, a tapped density of 41, an untapped density of 31, and a specific gravity of 2.65.

Organohydrogenpolysiloxane 1 is a trimethylsiloxy-terminated poly(dimethylsiloxane/methylhydrogensiloxane) having an average of 3 dimethylsiloxane units and 5 methylhydrogensiloxane units per molecule and containing 0.8% of silicon-bonded hydrogen atoms.

Unsaturated ester-functional compound 1 is neopentylglycol diacrylate.

Unsaturated ester-functional compound 2 is neopentylglycol dimethacrylate.

Fluoroorganosilicone 1 is dimethylvinylsiloxy-terminated methyl 3,3,3-trifluoropropyl siloxane having 0.5 to 2% vinyl groups and a viscosity of 310 to 2000 cSt at 25° C.

Fluoroorganosilicone 2 is trimethylsiloxy-terminated poly(methylhydrogensiloxane/methyl-6,6,6,5,5,4,4,3,3-nonafluorohexylsiloxane) having an average of 28 methylhydrogensiloxane units and 12 methyl-6,6,6,5,5,4,4,3,3-nonafluorohexyl siloxane units per molecule.

Organohydrogenpolysiloxane 2 is methylhydrogen siloxane having a viscosity of 20 to 40 cSt at 25° C. and 1.4 to 1.75% hydrogen by weight.

Cure Modifier 1 is 3,5-dimethyl-1-hexyn-3-ol.

Reinforcing Silica is hexamethyldisilazane-treated silica having a BET surface area of between 200 and 250 meters squared per gram ($m^2/g$), pH of 4.5 to 6.5, and moisture content not exceeding 0.6% measured gravimetrically at 105° C. This material is sold under the name of Cab-O-Sil TS-530 by Cabot Corporation.

Rheology modifier is a trimethylsiloxy-terminated dimethyl, methyl(propyl(poly(propyleneoxide)hydroxy)) siloxane copolymer, having a viscosity of 140 to 190 centiStokes (cSt). Rheology modifier is sold under the name of 1248 Fluid by Dow Corning Corporation.

The following substrates are used in these examples.

FR-4 is the epoxy side of a copper-clad FR-4 (glass-reinforced epoxy) laminate having a thickness of 0.152 centimeters (cm), which is available from Laird Plastics (West Palm Beach, Fla.).

PC is a Bisphenol A polycarbonate sheet having a thickness of 0.635 cm, which is sold under the name HYZOD M by Exotic Automation & Supply (Farmington Hills, Mich.).

PBT is a poly(butylene terephthalate) resin sheet having a thickness of 0.635 cm, which is sold under the name HYDEX 4101 (white) by Boedeker Plastics, Inc. (Shiner, Tex.).

GF-PBT is a glass-reinforced poly(butylene terephthalate) resin sheet having a thickness of 0.318 cm, which is sold under the name Celanex 3300 D (black) by Ticona (Summit, N.J.).

N66 is an extruded nylon type 6/6 polyamide resin sheet having a thickness of 0.635 cm, which is available from Boedeker Plastics, Inc. (Shiner, Tex.).

ABS is an acrylonitrile-butadiene-styrene sheet having a thickness of 0.635 cm, which is available from Boedeker Plastics, Inc. (Shiner, Tex.).

PPO is a styrene-modified poly(phenylene oxide) sheet having a thickness of 0.635 cm, which is sold under the name NORYL EN-265 (black) by Boedeker Plastics, Inc. (Shiner, Tex.).

PPS is a poly(phenylene sulfide) sheet having a thickness of 0.318 cm, which is sold under the trademark TECHTRON PPS (natural) by Boedeker Plastics, Inc. (Shiner, Tex.).

Al is a die-cast aluminum having a thickness of 0.163 cm.

SS is a 304 stainless steel alloy (Type SS-34) panel having a thickness of 0.160 cm, which is available from Q-Panel Lab Products (Cleveland, Ohio).

Cu is the copper side of a copper-clad FR-4 (glass-reinforced epoxy) laminate having a thickness of 0.152 cm, which is available from Laird Plastics (West Palm Beach, Fla.).

PA-sPS1 is a thermoplastic which comprises 70% of a blend and 30% glass filler. The blend comprises 70% Nylon 66 and 30% syndiotactic polystyrene. PA-sPS1 is commercially available from The Dow Chemical Company (Midland, Mich.).

PA-sPS2 is a thermoplastic which comprises 90% of a blend and 10% glass filler. The blend comprises 70% Nylon 66 and 30% syndiotactic polystyrene. PA-sPS2 is commercially available from The Dow Chemical Company (Midland, Mich.).

PA-sPS3 is a thermoplastic which comprises 70% of a blend and 30% glass filler. The blend comprises 50% Nylon 66 and 50% syndiotactic polystyrene. PA-sPS3 is commercially available from The Dow Chemical Company (Midland, Mich.).

Vinyl ester is a compression molded glass-filled vinylester thermoset substrate available from The Dow Chemical Company under the trade name of Premi-Glas® 1285VE.

PPA is a 30% glass-filled polyphthalamide. The polyphthalamide resin is available from Solvay Advanced Polymers under the trade name of Amodel®.

Reference Example 1

Cleaning of Substrates

Plastic substrates, except Nylon, are first cleaned in an ultrasonic bath containing a dilute soap solution to remove machine oils and other hydrocarbon residues, and are rinsed in clean water. Immediately before use, each plastic substrate is repeatedly cleaned by drawing a Kimwipe disposable wiper saturated with isopropyl alcohol over the test surface. In the final cleaning step, isopropyl alcohol is applied to the test surface using a TECHNICLOTH TX604 clean room wiper (The Texwipe Company, Upper Saddle River, N.J.). The test surface of each Nylon substrate is sprayed with isopropyl alcohol, is wiped with a Kimwipe, is sprayed with acetone, and is wiped with a TECHNICLOTH TX604 clean room wiper. Metal substrates are cleaned in a similar manner using heptane followed by isopropyl alcohol. All substrates are allowed to air-dry for at least twenty minutes before application of a silicone composition.

Reference Example 2

Preparation of Specimens for Scrape Adhesion Testing and Measurement of Scrape Adhesion The freshly prepared adhesive composition is drawn over the surface of a cleaned substrate with a doctor blade to achieve a film thickness of 0.025 in. (0.0635 cm). The coated substrate is then heated in a forced air convection oven at a temperature of 150° C. for 30 minutes and then is allowed to cool to room temperature. The substrate is scored with a razor blade to form two parallel lines separated by 0.25 in. (0.635 cm), penetrating through the adhesive layer and into the substrate.

A stainless steel microspatula (Fisherbrand 21-401-5) having rounded ends is brought into contact with the adhesive surface between the two parallel score lines, described above, at an angle of approximately 30° from the surface. A manual force is exerted on the spatula along the track between the score lines in an attempt to scrape the adhesive from the surface of the substrate. The failure mode is reported as adhesive, cohesive, or a combination thereof. Adhesive failure denotes clean debonding (release) of the silicone product from the substrate. Cohesive failure denotes fracture (splitting) of the silicone product itself and adherence of residue to the substrate.

Reference Example 3

Preparation of Lap Shear Specimens and Measurement of Adhesion by Single Lap Shear Testing Cleaned substrates are placed in a machined aluminum support jig designed to support two 3-inch long substrate panels with an overlap area of 1 square inch, or 0.5 square inches, and a bondline thickness of 0.030 inches. The adhesive composition to be tested is applied with a microspatula, spreading out carefully to not incorporate air into the sample. A second cleaned substrate is placed over the adhesive and is compressed to form the appropriate thickness by lightly screwing down the upper restraining bar. Samples are transferred to a convection oven pre-set to 150° C. and are allowed to cure for 60 min. Following removal from the oven and cooling to room temperature, the specimens are removed from the jigs, and all excess adhesive is trimmed away completely from the edges of the lap region with a razor blade. After 24 hours, the samples are loaded into a MTS Sintech 5/G tensile tester equipped with a 5000 pound-force transducer and tested at a crosshead speed of 2 inches per minute (in/min) (0.085 cm/second) (under ambient conditions). Median values of maximum stress from at least three replicates of each substrate/composition combination are reported along with mode of failure rated by estimated percentage of total bond area exhibiting cohesive failure (CF). In cases where fracture occurs through the silicone product but very close to one of the substrate surfaces to leave only a thin film of residue, this effect is additionally noted as "thin film" failure.

Reference Example 4

Preparation of Specimens for Chemical Resistance Testing and Measurement of Chemical Resistance The adhesive composition is coated on substrates and cured as described in Reference Example 3. The resulting samples are immersed continuously in 10W30 motor oil at 150° C. for 500 hours without changing the oil. Shear strength of the adhesive is measured before and after oil immersion.

Reference Example 5

Determination of Interface Compositions by Surface Analysis

Samples are cast to a standard thickness of 0.025 inch (in) (0.0635 centimeter) the manner described in Reference Example 2, except that the samples are cured for 30 minutes in a convection oven pre-heated to 70° C., on polycarbonate substrates 101 cleaned as described in Reference Example 1 and as shown in the schematic shown in FIG. 1. Cured samples 102 are examined spectroscopically in multiple spots along three planes of interest: the free surface 103, bulk 104, and substrate interface 105, as represented. To avoid atmospheric contamination, samples are loosely wrapped in clean, heavy gauge aluminum foil prior to and after testing. The substrate interface is exposed by carefully peeling away the cured film, if possible. In cases of very strong adhesion, the samples are either cryogenically fractured or carefully cut away to expose the interface. In the latter case, spectra from both sides of the interface are compared to ensure the separation did not occur cohesively. Bulk spectra are obtained from fresh areas exposed by slicing away a thin layer from the surface with a clean microtome blade. No attempt is made to control the thickness of this slice precisely because this technique gave access to areas that were well beyond the 1–2 micrometer (μm) depths where gradients are strongest. This is confirmed by good reproducibility among bulk spectra from random slices.

Reference Example 6

Surface Analysis by X-Ray Photoelectron Spectroscopy

X-ray photoelectron spectroscopy (XPS) analyses are obtained using a Kratos AXIS 165 instrument with a monochromatic x-ray source at 280 W. Charge compensation is employed. This method gives an analysis spot size of 0.7 millimeters (mm)×1.4 mm. Three short strips are cut from each sample to provide substrate (105) and air (103) interfaces and a 'bulk' (104) composition (numbers used to describe the various surfaces are shown in FIG. 1). The strips are 3–5 mm wide and 10–15 mm long. The samples are mounted to a long sample stage using metal clips. Two positions (106, 107) on each strip are analyzed by XPS. A low resolution survey spectrum and high resolution spectra of O, C and Si are obtained at each position analyzed.

Reference Example 7

Surface Analysis by ATR-IR Test Method

A Spectratech attenuated total reflectance infrared spectroscopy (ATR-IR) microscope is used to compare concentration at various depths of cured silicone films. This apparatus is equipped with an ATR objective lens consisting of a hemispherical Zn—Se crystal providing an angle of incidence of 38.68°. This geometry probes a depth of 2±0.5 μm in the IR regions of interest. The sample is raised gently until a standard contact pressure reading is reached on a stage-mounted pressure sensor to ensure similar levels of contact for all spectra. Between each new spectrum, the crystal is cleaned by gently wiping with a Kimwipe moistened with analytical grade heptane and allowed to dry completely. In all ATR-IR experiments, sample chambers are thoroughly purged with dry nitrogen gas before obtaining background spectra. Each spectrum is generated with 256 scans. Absorption peak height analysis is performed with standardized baseline points using Omnic™ software.

Figure 2:
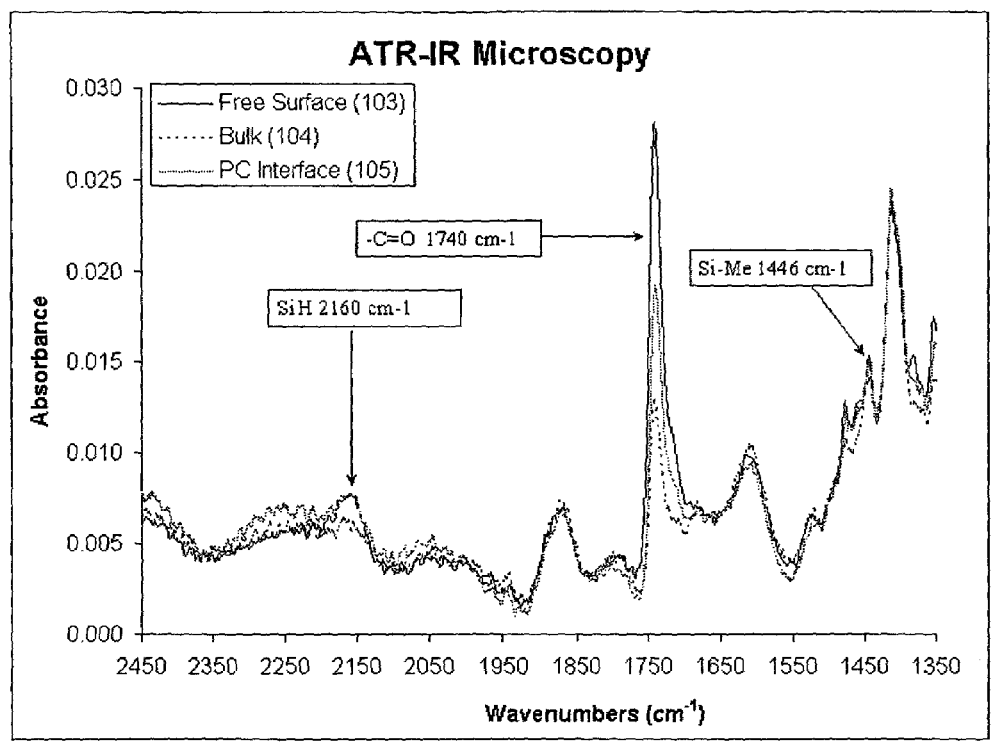
FIG. 2 shows representative ATR-IR spectra from each surface represented in FIG. 1 using a cured film of Example 4. Spectra are expanded in the region of spectral interest to show key IR bands.
Figure 3:
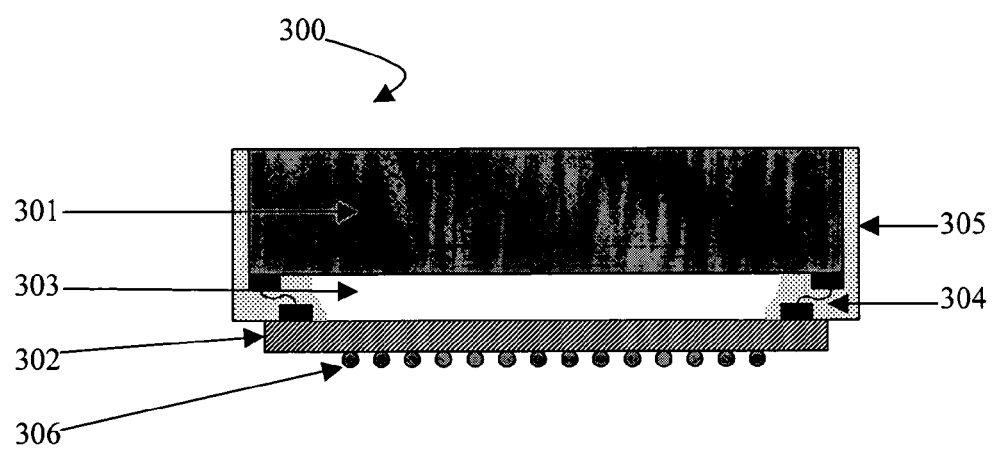
FIG. 3 shows an example of a package in which the composition of this invention is used as a die attach adhesive.
Figure 4:
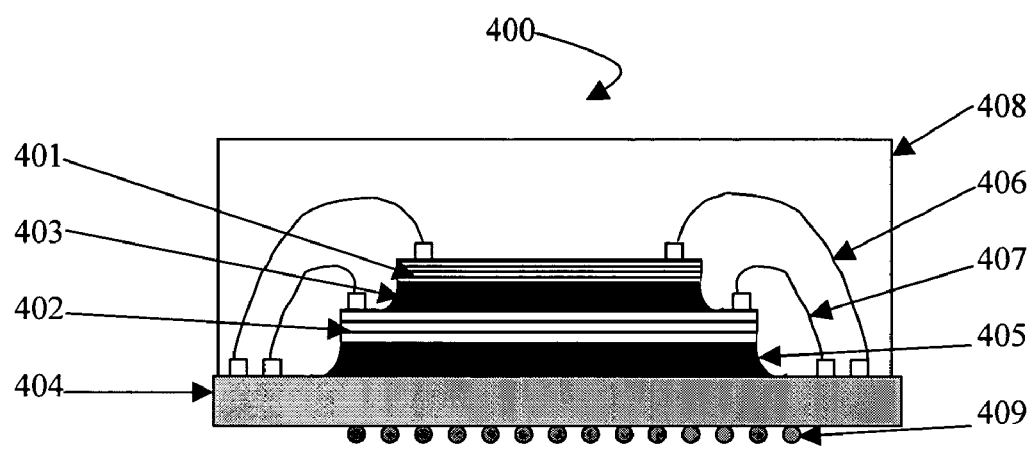
FIG. 4 shows an example of a package in which the composition of this invention is used as a die attach adhesive.

Three replicate spectra (depicted schematically as spots 106, 107, 108 in FIG. 1) are obtained at each of the three surfaces (spots 103, 104, 105). For each spectrum (such as any of the three spectra shown in FIG. 2), the normalized peak heights for both the carbonyl (—C═O) stretch at 1740 cm$^{-1}$ and silicon hydride (—Si—H) at 2160 cm$^{-1}$ are calculated by dividing by the peak height of the silicon-methyl (—Si—Me) band at 1446 cm$^{-1}$. The normalized peak heights are then averaged over the three replicates. Comparison of the relative level of interface enrichment with respect to the bulk is made by dividing the average normalized peak ratio for the air and substrate interfaces (103 and 105, respectively) by the corresponding value in the bulk (104).

Example 1

Two-part Adhesive Composition

A two-part adhesive composition is prepared. Part A is prepared by mixing 93.3 parts Blend 1, 0.7 part Catalyst 1, 4.8 parts Adhesion Promoter 1, 0.6 part Void Reducing Agent, and 0.6 part Pigment. Part B is prepared by mixing 36.1 parts of Blend 1, 43.4 parts of Quartz, 5.1 parts Organohydrogenpolysiloxane 1, 3.1 parts Unsaturated ester-functional compound 1, 4.9 parts Fluoroorganosilicone 1, 0.6 part Organohydrogenpolysiloxane 2, and 6.8 parts Fluoroorganosilicone 2.

Parts A and B are mixed in a 2.6:1 (A:B) ratio using a Hauschild mixer for two 12 second mixing cycles. The resulting adhesive composition is cured and tested according to the method of Reference Example 2. The results are in Table 1. The resulting adhesive composition is cured and tested according to the method of Reference Example 4. The results are in Table 2.

Comparative Example 1

A two-part adhesive composition is prepared. Part A is prepared by mixing 94.0 parts Blend 1, 0.6 part Catalyst 1, 4.8 parts Adhesion Promoter 1, and 0.6 part Pigment. Part B is prepared by mixing 47.7 parts of Blend 1, 47.1 parts of Quartz, 4.3 parts Organohydrogenpolysiloxane 1, and 0.83 part Organohydrogenpolysiloxane 2.

Parts A and B are mixed in a 2.0:1 (A:B) ratio using a Hauschild mixer for two 12 second mixing cycles. The resulting adhesive composition is cured and tested according to the method of Reference Example 2. The results are in Table 1. The resulting adhesive composition is cured and tested according to the method of Reference Example 4. The results are in Table 2.

TABLE 1

| Substrate | Failure of Adhesive of Example 1 | Failure of Adhesive of Comparative Example 1 |
|---|---|---|
| PA-sPS2 | 100% cohesive | Adhesive |
| Al | 100% cohesive | 100% cohesive |
| Vinyl ester | 100% cohesive | 100% cohesive |
| FR-4 | 100% cohesive | 100% cohesive |
| PC | 100% cohesive | Adhesive |
| N66 | 100% cohesive | Adhesive |
| GF-PBT | 100% cohesive | 100% Cohesive |
| PBT | Partially cohesive | Adhesive |
| PPO | 100% cohesive | 100% cohesive |
| PPS | 100% cohesive | Partially cohesive |
| PPA | 100% cohesive | 100% cohesive |
| Cu | 100% cohesive | 100% cohesive |
| SS | 100% cohesive | 100% cohesive |
| ABS | 100% cohesive | Partially cohesive |

TABLE 2

| Substrate | Example 1 Shear Strength & Failure Mode before Immersion kPa (% CF) | Example 1 Shear Strength & Failure Mode after Immersion kPa (% CF) | Comparative Example 1 Shear Strength & Failure Mode before Immersion kPa (% CF) | Comparative Example 1 Shear Strength & Failure Mode after Immersion kPa (% CF) |
|---|---|---|---|---|
| PA-sPS1 | 3206 ± 310 (100%) | Not measured | 1593 ± 103 (0%) | Not measured |
| PA-sPS2 | 3096 ± 186 (100%) | Not measured | 2158 ± 69 (60%) | Not measured |
| PA-sPS3 | 2765 ± 138 (100%) | Not measured | 1600 ± 110 (0%) | Not measured |
| Vinyl Ester | 3330 ± 138 (100%) | 1813 ± 97 (100%*) | 3006 ± 414 (100%) | 1248 ± 193 (100%*) |

*Denotes that up to 20% of the failure surface showed a thin film residue of silicone, with the remainder of the area showing fracture through the center of the silicone product.

Example 1 and Comparative Example 1 show that the combination of mixture of organohydrogenpolysiloxanes, the Fluoroorganosilicone additive, and the unsaturated ester-functional compound provide improved adhesion and chemical resistance.

Example 2

Adhesive Composition

A one-part adhesive composition is prepared by mixing 52.76 parts Blend 1, 29.97 parts Quartz, 0.19 part Catalyst 1, 1.32 parts Adhesion Promoter 1, 0.18 part Void Reducing Agent, 0.18 part Pigment, 4.17 parts Organohydrogenpolysiloxane 1, 2.20 parts Unsaturated ester functional compound 1, 3.52 parts Fluoroorganosilicone 1, 0.45 part Organohydrogenpolysiloxane 2, 4.90 parts Fluoroorganosilicone 2, and 0.18 part Cure Modifier 2. Lap shear strength is tested according to the method of Reference Example 3. The results are in Table 3. $SiH_B/Vi_A$ is 3.7 and $SiH_{tot}/Vi_{tot}$ is 1.55.

Example 3

Composition of Example 2 with Optional Components

A one-part adhesive composition is prepared by mixing 50.59 parts Blend 1, 28.47 parts Quartz, 0.19 part Catalyst 1, 1.33 parts Adhesion Promoter 1, 0.18 part Void Reducing Agent, 0.18 part Pigment, 4.02 parts Organohydrogenpolysiloxane 1, 2.21 parts Unsaturated ester functional compound 1, 3.54 parts Fluoroorganosilicone 1, 0.45 part Organohydrogenpolysiloxane 2, 4.92 parts Fluoroorganosilicone 2, 0.18 part Cure Modifier 2, 3.54 parts Reinforcing Silica, and 0.22 part Rheology modifier.

Lap shear strength is tested according to the method of Reference Example 3. The results are in Table 3. Example 3 shows that addition of rheology modifiers and reinforcing fillers is not detrimental to the effectiveness of this invention.

Comparative Example 2

Adhesive Composition without Fluoroorganosilicones Unsaturated Ester, and Organohydrogenpolysiloxane 2

A one-part adhesive composition is prepared by mixing 62.26 parts Blend 1, 31.64 parts Quartz, 0.19 part Catalyst 1, 1.36 parts Adhesion Promoter 1, 0.20 part Void Reducing Agent, 0.20 part Pigment, 3.96 parts Organohydrogenpolysiloxane 1, and 0.18 part Cure Modifier 2. Lap shear strength is tested according to the method of Reference Example 3. The results are in Table 3.

Comparative Example 3

Adhesive Composition without Fluoroorganosilicones and Unsaturated Ester Compound, but with Organohydrogenpolysiloxane 2

A one-part adhesive composition is prepared by mixing 62.43 parts Blend 1, 31.73 parts Quartz, 0.19 part Catalyst 1, 1.36 parts Adhesion Promoter 1, 0.20 part Void Reducing Agent, 0.20 part Pigment, 3.34 parts Organohydrogenpolysiloxane 1, 0.36 part Organohydrogenpolysiloxane 2, and 0.18 part Cure Modifier 2. Lap shear strength is tested according to the method of Reference Example 3. The results are in Table 3.

TABLE 3

| Substrate | Example 2 Lap Shear Strength & Mode of Failure kPa (% CF) | Example 3 Lap Shear Strength & Mode of Failure kPa (% CF) | Comparative Example 2 Lap Shear Strength & Mode of Failure kPa (% CF) | Comparative Example 3 Lap Shear Strength & Mode of Failure kPa (% CF) |
|---|---|---|---|---|
| PA-sPS1 | 2275 ± 276 (100%) | 2834 ± 117 (90%) | 689 ± 90 (0%) | 1014 ± 83 (0%) |
| PA-sPS2 | 2455 ± 317 (100%) | 2717 ± 372 (100%) | 1813 ± 338 (100%) | 2675 ± 296 (100%) |

TABLE 3-continued

| Substrate | Example 2 Lap Shear Strength & Mode of Failure kPa (% CF) | Example 3 Lap Shear Strength & Mode of Failure kPa (% CF) | Comparative Example 2 Lap Shear Strength & Mode of Failure kPa (% CF) | Comparative Example 3 Lap Shear Strength & Mode of Failure kPa (% CF) |
|---|---|---|---|---|
| PA-sPS3 | 2068 ± 124 (100%, thin film) | 2317 ± 90 (100%, thin film) | 1041 ± 83 (0%) | 1069 ± 110 (0%) |

Example 2 and Comparative Example 2 illustrate that the combination of mixture of organohydrogenpolysiloxanes, the Fluoroorganosilicone additives, and the unsaturated ester functional compound provide improved adhesion to polyamide-syndiotactic blends. Comparative Example 3 shows that a similar improvement in adhesion is not achieved by use of a organohydrogenpolysiloxane mixture alone in this composition.

Comparative Example 4

Composition of Example 2 without Unsaturated Ester-Functional Compound

A one-part adhesive composition is prepared by mixing 57.53 parts Blend 1, 32.67 parts Quartz, 0.21 part Catalyst 1, 1.32 parts Adhesion Promoter 1, 0.19 part Void Reducing Agent, 0.19 part Pigment, 3.08 parts Organohydrogenpolysiloxane 1, 3.84 parts Fluoroorganosilicone 1, 0.45 part Organohydrogenpolysiloxane 2, 0.32 part Fluoroorganosilicone 2, and 0.19 part Cure Modifier 2. Lap shear strength is tested according to the method of Reference Example 3. The results are in Table 4.

Comparative Example 5

Composition of Example 2 without Unsaturated Ester-Functional Compound and with Equivalent Weight of Fluoroorganosilicone A one-part adhesive composition is prepared by mixing 56.42 parts Blend 1, 32.05 parts Quartz, 0.21 part Catalyst 1, 1.32 parts Adhesion Promoter 1, 0.19 part Void Reducing Agent, 0.19 part Pigment, 0.57 part Organohydrogenpolysiloxane 1, 3.53 parts Fluoroorganosilicone 1, 0.45 part Organohydrogenpolysiloxane 2, 4.89 parts Fluoroorganosilicone 2, and 0.19 part Cure Modifier 1. Lap shear strength is tested according to the method of Reference Example 3. The results are in Table 4.

Comparative Example 6

Composition Example 2 without Fluoroorganosilicones

A one-part adhesive composition is prepared by mixing 56.43 parts Blend 1, 32.05 parts Quartz, 0.21 part Catalyst 1, 1.32 parts Adhesion Promoter 1, 0.19 part Void Reducing Agent, 0.19 part Pigment, 6.77 parts Organohydrogenpolysiloxane 1, 2.21 parts Unsaturated ester functional compound 1, 0.45 part Organohydrogenpolysiloxane 2, and 0.19 part Cure Modifier 2. Lap shear strength is tested according to the method of Reference Example 3. The results are in Table 4.

TABLE 4

| Substrate | Comparative Example 4 Lap Shear Strength (kPa) | Mode of Failure (% CF) | Comparative Example 5 Lap Shear Strength (kPa) | Mode of Failure (% CF) | Comparative Example 6 Lap Shear Strength (kPa) | Mode of Failure (% CF) |
|---|---|---|---|---|---|---|
| PA-sPS1 | 1800 ± 200 | 80 | 827 ± 131 | 50 | 2779 ± 138 | 100 |
| PA-sPS3 | 1648 ± 28 | 10 | 687 ± 7 | 100 (thin film) | 2034 ± 152 | 70 (thin film) |

Example 4

Composition for Surface Analysis

A two-part model base formulation is prepared by mixing 35.1 parts of PDMS 1, 64.7 parts of Quartz, and 0.39 part of Catalyst 1 as Part A. Part B is prepared by mixing 37.8 pats of PDMS 1, 59.9 parts Quartz, and 2.31 parts Organohydrogenpolysiloxane 1.

To 4.65 parts of Part A of the Base formulation is added 0.25 part of Unsaturated ester functional compound 2. To 4.65 parts of Part B of the Base formulation is added 0.46 part of Fluoroorganosilicone 2. Parts A and B are hand mixed with a microspatula, and the mixture is cast into a film sample according to the method described in Reference Example 5. The sample is analyzed according to the methods of Reference Example 6 and Reference Example 7. The results are in Tables 5 and 6 and FIG. 2.

Comparative Example 7

Composition without Fluoroorganosilicone Additive

To 4.74 parts of Part A of the Base formulation of Example 4 is added 0.25 part of Unsaturated ester functional compound 2. To 4.74 parts of Part B of the Base formulation of Example 4 is added 0.27 part of Organohydrogenpolysiloxane 1, an amount giving a ratio of 1 mol of SiH per mole of methacryloyloxy functionality from Unsaturated ester functional compound 2. Parts A and B are then hand mixed with a microspatula, and the mixture is cast into a film sample according to the method described in Reference Example 5. The sample is analyzed according to the methods of Reference Example 6 and Reference Example 7. The results are in Tables 5 and 6 and FIG. 2.

TABLE 5

Reference Example 6 Results

Example 4

| | Free Surface (103) | | Bulk (104) | | PC Interface (105) | |
|---|---|---|---|---|---|---|
| Spot | 106 | 107 | 106 | 107 | 106 | 107 |
| Element | | | | | | |
| F | 29.3 | 30.3 | 3.9 | 4.0 | 12.3 | 12.4 |
| O | 16.3 | 16.2 | 25.5 | 25.5 | 22.4 | 22.7 |
| C | 44.5 | 43.9 | 48.5 | 48.6 | 47.5 | 46.9 |
| Si | 9.9 | 9.6 | 22.2 | 22.0 | 17.8 | 18.0 |
| C:Si Ratio | 4.5:1 | 4.6:1 | 2.2:1 | 2.2:1 | 2.7:1 | 2.6:1 |
| Hi Res C Spectra | | | | | | |

| | Free Surface (103) | | Bulk (104) | | PC Interface (105) | |
|---|---|---|---|---|---|---|
| Spot | 106 | 107 | 106 | Spot | 106 | 107 |
| C1s Peak | | | | | | |
| Aliphatic C | 63.2 | 60.1 | 93.3 | 93.1 | 82.1 | 82.4 |
| C—O | 7.8 | 9.7 | 2.5 | 2.7 | 6.8 | 7.7 |
| C=O | 3.6 | 3.8 | 1.0 | 1.0 | 2.0 | 1.6 |
| CF2 | 18.9 | 19.6 | 2.2 | 2.2 | 6.6 | 6.2 |
| CF3 | 6.5 | 6.8 | 1.0 | 1.1 | 2.5 | 2.1 |

Comparative Example 7

| | Free Surface (103) | | Bulk (104) | | PC Interface (105) | |
|---|---|---|---|---|---|---|
| Spot | 106 | 107 | 106 | 107 | 106 | 107 |
| Element | | | | | | |
| F | ND | ND | ND | ND | ND | ND |
| O | 25.6 | 25.5 | 27.0 | 26.7 | 26.0 | 26.0 |
| C | 51.8 | 51.9 | 49.9 | 50.1 | 52.5 | 52.3 |
| Si | 22.6 | 22.6 | 23.1 | 23.2 | 21.5 | 21.7 |
| C:Si Ratio | 2.3:1 | 2.3:1 | 2.2:1 | 2.2:1 | 2.4:1 | 2.4:1 |
| Hi Res C Spectra | | | | | | |

| | Free Surface (103) | | Bulk (104) | | PC Interface (105) | |
|---|---|---|---|---|---|---|
| Spot | 106 | 107 | 106 | Spot | 106 | 107 |
| C1s Peak | | | | | | |
| Aliphatic C | 98.6 | 97.4 | 97.4 | 96.7 | 95.0 | 95.5 |
| C—O | 1.4 | 1.8 | 2.1 | 2.4 | 3.3 | 3.0 |
| C=O | ND | 0.8 | 0.5 | 0.9 | 1.7 | 1.5 |
| CF2 | ND | ND | ND | ND | ND | ND |
| CF3 | ND | ND | ND | ND | ND | ND |

ND means not detected.

TABLE 6

Reference Example 7 Results

| Area | | Example 4 | Comparative Example 7 |
|---|---|---|---|
| Free Surface (103) | —C=O | 2.1 | 0.8 |
| | —Si—H | 2.7 | 1.7 |
| Bulk (104) | —C=O | 1.0 | 1.0 |
| | —Si—H | 1.0 | 1.0 |
| Interface (105) | —C=O | 1.5 | 1.0 |
| | —Si—H | 1.8 | 0.4 |

Example 4 and Comparative Example 7 demonstrate spectroscopically that the combination of Unsaturated ester functional compound 2 and Fluoroorganosilicone 2 in an addition curing silicone matrix provides enhanced enrichment of these species at the air and plastic interfaces. Therefore, without wishing to be bound by theory, it is expected that the combination of the unsaturated ester-functional compound and the fluoroorganosilicone provide commensurate modification of properties dependent upon surface and interface composition, such as adhesion and chemical resistance.

Comparative Example 8

A composition is prepared by mixing components (A), (B), (C), and (D). Component (A) is 56.75 parts Blend 1, 0.21 parts Catalyst 1, 2.67 parts Organohydrogenpolysiloxane 1, 0.19 parts Cure Modifier 1, 0.19 parts Void Reducing Agent, and 0.19 parts pigment. Organohydrogenpolysiloxane 1 is added in an amount such that 1.9 mol of SiH groups in Organohydrogenpolysiloxane 1 are available per mol of Si-attached alkenyl groups in the unsaturated polyorganosiloxane of component (A) ($SiH_B:Vi_A$ is 1.9:1).

(B) is 32.23 parts Quartz.
(C) is 1.42 parts Adhesion Promoter 1 and 2.37 parts Unsaturated Ester-functional Compound 1.
(D) is 3.79 parts Fluoroorganosilicone 1.

The content of species having silicon-bonded hydrogen atoms and species having aliphatically unsaturated groups is such that $SiH_{tot}/Vi_{tot}$ is 0.51. Lap shear strength is tested according to the method of Reference Example 3. The results are in Table 7.

Comparative Example 9

A composition is prepared by mixing components (A), (B), (C), and (D). Component (A) is 55.83 parts Blend 1, 0.20 parts Catalyst 1, 4.25 parts Organohydrogenpolysiloxane 1, 0.19 parts Cure Modifier 1, 0.19 parts Void Reducing Agent, 0.19 parts Pigment. Organohydrogenpolysiloxane 1 is added in an amount such that $SiH_B/Vi_A$ is 3.0.

(B) is 31.71 parts Quartz.
(C) is 1.40 parts Adhesion Promoter 1 and 2.33 parts Unsaturated Ester-functional Compound 1.
(D) is 3.72 parts Fluoroorganosilicone 1.

The content of species having silicon-bonded hydrogen atoms and species having aliphatically unsaturated groups is such that $SiH_{tot}/Vi_{tot}$ is 0.83. Lap shear strength is tested according to the method of Reference Example 3. The results are in Table 7.

Comparative Example 10

A composition is prepared by mixing components (A), (B), (C), and (D). Component (A) is 54.01 parts Blend 1, 0.20 parts Catalyst 1, 2.13 parts Organohydrogenpolysiloxane 1, 0.23 parts Organohydrogenpolysiloxane 2, 0.18 parts Cure Modifier 1, 0.18 parts Void Reducing Agent, 0.18 parts Pigment. Organohydrogenpolysiloxane 1 is added in an amount such that $SiH_B:Vi_A$ is 1.9.

(B) is 30.67 parts Quartz.

(C) is 1.35 parts Adhesion Promoter 1 and 2.25 parts Unsaturated Ester-functional Compound 1.

(D) is 3.60 parts Fluoroorganosilicone 1 and 5.01 parts Fluoroorganosilicone 2.

The content of species having silicon-bonded hydrogen atoms and species having aliphatically unsaturated groups is such that $SiH_{tot}/Vi_{tot}$ is 1.04. Lap shear strength is tested according to the method of Reference Example 3. The results are in Table 7.

Example 5

A composition is prepared by mixing components (A), (B), (C), and (D). Component (A) is 54.68 parts Blend 1, 0.20 parts Catalyst 1, 5.09 parts organohydrogenpolysiloxane 1, 0.18 parts Cure Modifier 1, 0.18 parts Void Reducing Agent, 0.18 parts Pigment. $SiH_B/Vi_A$ is 3.7

(B) is 31.06 parts Quartz.

(C) is 1.37 parts Adhesion Promoter 1 and 2.28 parts Unsaturated Ester-functional Compound 1.

(D) is 4.77 parts Fluoroorganosilicone 2.

The content of species having silicon-bonded hydrogen atoms and species having aliphatically unsaturated groups is such that $SiH_{tot}/Vi_{tot}$ is 1.56. Lap shear strength is tested according to the method of Reference Example 3. The results are in Table 7.

TABLE 7

| | Median Lap Shear Adhesion Strengths | | | | |
|---|---|---|---|---|---|
| | Comparative Example 8 (kPa) | Comparative Example 9 (kPa) | Comparative Example 10 (kPa) | Example 2 (kPa) | Example 5 (kPa) |
| PA-sPS1 | Uncured | 96 ± 8 | 969 ± 68.3 | 2275 ± 276 | 3146 ± 141 |
| PA-sPS2 | Uncured | 175 ± 12 | 610 ± 222 | 2455 ± 317 | 3248 ± 297 |
| PA-sPS3 | Uncured | 56 ± 3 | 1302 ± 139.3 | 2068 ± 124 | 2188 ± 69 |
| Al | Uncured | Not Measured | Not Measured | 3958 ± 359 | 3337 ± 227 |
| Cu | Uncured | Not Measured | Not Measured | 4362 ± 126 | 3978 ± 78 |
| SS | Uncured | Not Measured | Not Measured | 3619 ± 105 | 4459 ± 473 |

Comparative Examples 7, 8, and 9 show that some formulations having insufficient $SiH_{tot}/Vi_{tot}$ ratios have insufficient curing or have poor adhesion to the Nylon-sPS blended plastics. Consequently, simply adding a reactive Fluoroorganosilicone additive into any hydrosilylation composition does not necessarily provide adhesion to plastics and metals.

INDUSTRIAL APPLICABILITY

The composition of this invention cures to form an adhesive. The adhesive adheres to metals. The adhesive also adheres to other substrates such as plastics.

We claim:

1. A composition prepared by mixing components comprising:

(I) a polyorganosiloxane having an average of at least two unsaturated organic groups per molecule, where component (I) is free of fluorine atoms;

(II) an organohydrogenpolysiloxane having an average of at least two silicon-bonded hydrogen atoms per molecule, where component (II) is free of fluorine atoms;

(III) a hydrosilylation catalyst;

(IV) a fluoroorganosilicone having at least one functional group reactive with component (I), component (II), or both;

(V) an unsaturated ester-functional compound comprising i)

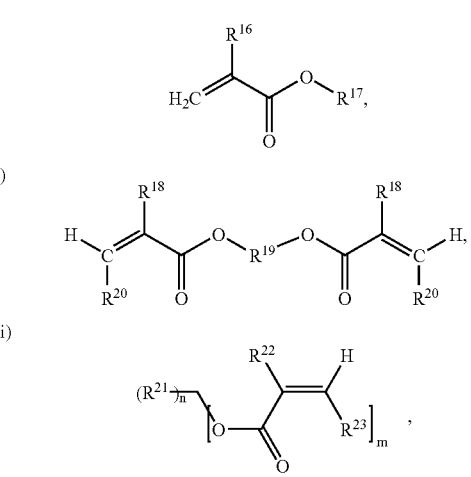

-continued iv) 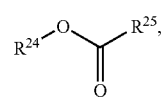

v) 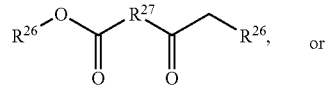

or v) a combination thereof; where in formula i), each $R^{18}$ is independently a hydrogen atom, a monovalent hydrocarbon group of 1 to 4 carbon atoms, or $CF_3$, each $R^{19}$ is independently a divalent organic group of 1 to 20 carbon atoms, each $R^{20}$ is independently a hydrogen atom or a monovalent hydrocarbon group of 1 to 20 carbon atoms, in formula ii), n has an average value of 0 to 2 and m =4−n, each $R^{21}$ is independently a hydroxyl group, or $CF^3$.

each $R^{22}$ is independently a hydrogen atom, a monovalent hydrocarbon group of 1 to 4 carbon atoms, or $CF^3$, each $R^{23}$ is independently a hydrogen atom or a monovalent hydrocarbon group of 1 to 20 carbon atoms, in formula iii), each $R^{24}$ is independently a fluoroalkyl group, an epoxy functional group, or a polyether group with the proviso that at least one of $R^{24}$ or $R^{25}$ is unsaturated, each $R^{25}$ is independently an oxygen-bridged monovalent organic group or a carbon-bridged carbonyl group, in formula iv), each $R^{26}$ is independently a monovalent organic group or a hydrogen atom, with the proviso that at least one $R^{26}$ is an aliphatically unsaturated monovalent organic group or a hydrogen atom, and each $R^{27}$ is independently an oxygen atom or a divalent organic group; and (VI) an adhesion promoter.

2. The composition of claim 1, where component (I) comprises a polyorganosiloxane of the formula:
(a) $R^1{}_3SiO(R^1{}_2SiO)_\alpha(R^1R^2SiO)_\beta SiR^1{}_3$,
(b) $R^3{}_2R^4SiO(R^3{}_2SiO)_\chi(R^3R^4SiO)_\delta SiR^3{}_2R^4$, or
(c) a combination thereof, where
α has an average value of 0 to 2000,
β has an average value of 2 to 2000,
each $R^1$ is independently a monovalent organic group,
each $R^2$ is independently an unsaturated monovalent organic group,
χ has an average value of 0 to 2000,
δ has an average value of 0 to 2000,
each $R^3$ is independently a monovalent organic group, and
each $R^4$ is independently an unsaturated monovalent organic group.

3. The composition of claim 1, where component (I) comprises:
i) dimethylvinylsiloxy-terminated polydimethylsiloxane,
ii) dimethylvinylsiloxy-terminated poly(dimethylsiloxane/methylvinylsiloxane),
iii) dimethylvinylsiloxy-terminated polymethylvinylsiloxane,
iv) trimethylsiloxy-terminated poly(dimethylsiloxane/methylvinylsiloxane),
v) trimethylsiloxy-terminated polymethylvinylsiloxane,
vi) dimethylvinylsiloxy-terminated poly(dimethylsiloxane/methylphenylsiloxane),
vii) dimethylvinylsiloxy-terminated poly(dimethylsiloxane/diphenylsiloxane),
viii) phenyl,methyl,vinyl-siloxy-terminated polydimethylsiloxane,
ix) dimethyl-acryloyloxypropyl-siloxy-terminated polydimethylsiloxane,
x) dimethyl-methacryloyloxypropyl-siloxy-terminated polydimethylsiloxane,
xi) dimethylhexenylsiloxy-terminated polydimethylsiloxane,
xii) dimethylhexenylsiloxy-terminated poly(dimethylsiloxane/methylhexenylsiloxane),
xiii) dimethylhexenylsiloxy-terminated polymethylhexenylsiloxane,
xiv) trimethylsiloxy-terminated poly(dimethylsiloxane/methylhexenylsiloxane),
xv) dimethylvinylsiloxy-terminated poly(dimethylsiloxane/methylcyanopropylsiloxane), or
xvi) combinations thereof.

4. The composition of claim 1, where component (I) comprises an MQ resin consisting essentially of $R^5{}_3SiO_{1/2}$ units and $SiO_{4/2}$ units, a TD resin consisting essentially of $R^5SiO_{3/2}$ units and $R^5{}_2SiO_{2/2}$ units, an MT resin consisting essentially of $R^5{}_3SiO_{1/2}$ units and $R^5SiO_{3/2}$ units, an MTD resin consisting essentially of $R^5{}_3SiO_{1,2}$ units, $R^5\ SiO_{3/2}$ units, and $R^5{}_2SiO_{2/2}$ units, or a combination thereof, where
each $R^5$ is a monovalent organic group of 1 to 20 carbon atoms, and
the resin contains an average of 3 to 30 mole percent of unsaturated organic groups.

5. The composition of claim 1, where component (II) comprises siloxane units selected from $HR^6{}_3SiO_{1/2}$, $R^6{}_3SiO_{1/2}$, $HR^6SiO_{2/2}$, $R^6{}_2SiO_{2/2}$, $R^6SiO_{3/2}$, $SiO_{4/2}$, or combinations thereof; where each $R^6$ is independently selected from monovalent organic groups free of aliphatic unsaturation.

6. The composition of claim 1, where component (II) comprises a compound of the formula:
(a) $R^7{}_3SiO(R^7{}_2SiO)_\epsilon(R^7HSiO)_\phi SiR^7{}_3$, or
(b) $R^8{}_2HSiO(R^8{}_2SiO)_\gamma(R^8HSiO)_\eta SiR^8{}_2H$,
(c) a combination thereof, where
ε has an average value of 0 to 2000,
φ has an average value of 2 to 2000,
each $R^7$ is independently a monovalent organic group free of aliphatic unsaturation,
γ has an average value of 0 to 2000,
η has an average value of 0 to 2000, and
each $R^8$ is independently a monovalent organic group free of aliphatic unsaturation.

7. The composition of claim 1, where component (II) comprises:
i) dimethylhydrogensiloxy-terminated polydimethylsiloxane,
ii) dimethylhydrogensiloxy-terminated poly(dimethylsiloxane/methylhydrogensiloxane),
iii) dimethylhydrogensiloxy-terminated polymethylhydrogensiloxane,
iv) trimethylsiloxy-terminated poly(dimethylsiloxane/methylhydrogensiloxane),
v) trimethylsiloxy-terminated polymethylhydrogensiloxane,
vi) a resin consisting essentially of $H(CH_3)_2SiO_{1/2}$ units and $SiO_{4/2}$ units, and
vii) combinations thereof.

8. The composition of claim 1, where component (II) comprises a combination of more than one organohydrogenpolysiloxane.

9. The composition of claim 1, where component (III) comprises a platinum metal, a rhodium metal, or an organometallic compound.

10. The composition of claim 1, where component (III) comprises a microencapsulated hydrosilylation catalyst.

11. The composition of claim 1, where component (IV) comprises a compound of the formula:
(a) $R^9{}_3SiO(R^9{}_2SiO)_\iota(R^9R^{10}SiO)_\phi SiR^9{}_3$,
(b) $R^{11}{}_2R^{12}SiO(R^{11}{}_2SiO)_\kappa(R^{11}R^{12}SiO)_\lambda SiR^{11}{}_2R^{12}$,
(c) $F_3C(CF_2)_\nu R^{13}-Si-[O-Si(R^{14})_2(R^{15})]_3$,
(d) a resinous or branched structure consisting essentially of $R^{15}R^{14}SiO_{1/2}$ units, CF$_3$(CF$_2$)$_\nu$R$^{13}$SiO$_{3/2}$ units, and optionally SiO$_{4/2}$ units, or
(e) a combination thereof; where
  ι has an average value of 0 to 2000,
  φ has an average value of 1 to 500,
  each R$^9$ is independently a hydrogen atom or a monovalent organic group, with the proviso that at least one R$^9$ is a hydrogen atom or an unsaturated monovalent organic group;
  each R$^{10}$ is independently a fluoro-functional organic group;
  κ has an average value of 0 to 2000;
  λ has an average value of 0 to 500;
  each R$^{11}$ is independently a hydrogen atom or a monovalent organic group, with the proviso that at least one R$^{11}$ is a hydrogen atom or an unsaturated monovalent organic group;
  each R$^{12}$ is independently a fluoro-functional organic group;
  each R$^{13}$ is independently a divalent organic group;
  each R$^{14}$ is independently a monovalent hydrocarbon group free of aliphatic unsaturation;
  ν is 0 to 10; and
  each R$^{15}$ is independently a hydrogen atom or an unsaturated monovalent organic group.

12. The composition of claim 1, where component (IV) comprises
  i) dimethylvinylsiloxy-terminated polymethyl3,3,3-trifluoropropyl siloxane,
  ii) dimethylvinylsiloxy-terminated poly(methylhydrogensiloxane/methyl-6,6,6,5,5,4,4,3,3-nonafluorohexylsiloxane),
  iii) trimethylsiloxy-terminated poly(methylhydrogensiloxane/methyl-6,6,6,5,5,4,4,3,3-nonafluorohexylsiloxane),
  iv) trimethylsiloxy-terminated poly(methylhydrogensiloxane/methyl-3,3,3-trifluoropropyl),
  v) trimethylsiloxy-terminated poly(methylvinylsiloxane/methyl-6,6,6,5,5,4,4,3,3-nonafluorohexylsiloxane) or
  vi) combinations thereof.

13. The composition of claim 1, where component (VI) comprises a transition metal chelate, an alkoxysilane, a combination of an alkoxysilane and a hydroxy-functional polyorganosiloxane, or a combination thereof.

14. The composition of claim 1, where component (VI) comprises an unsaturated alkoxysilane, an epoxy-functional alkoxysilane, an epoxy-functional siloxane, or a combination thereof.

15. The composition of claim 1, where component (VI) comprises an alkoxysilane of the formula R$^{28}_\mu$Si(OR$^{29}$)$_{(4-\mu)}$, where
  μ is 1, 2, or 3,
  each R$^{28}$ is independently a monovalent organic group, with the proviso that at least one R$^{28}$ is an unsaturated organic group or an epoxy-functional group, and
  each R$^{29}$ is independently an unsubstituted, saturated hydrocarbon group of at least 1 carbon atom.

16. The composition of claim 1, where component (VI) comprises 3-glycidoxypropyltrimethoxysilane, 3-glycidoxypropyltriethoxysilane, (epoxycyclohexyl)ethyldimethoxysilane, (epoxycyclohexyl)ethyldiethoxysilane, vinyltrimethoxysilane, allyltrimethoxysilane, allyltriethoxysilane, hexenyltrimethoxysilane, undecylenyltrimethoxysilane, 3-methacryloyloxypropyl trimethoxysilane, 3-methacryloyloxypropyl triethoxysilane, 3-acryloyloxypropyl trimethoxysilane, 3-acryloyloxypropyl triethoxysilane, or combinations thereof.

17. The composition of claim 1, further comprising (VII) a void reducing agent, (VIII) a pigment, (IX) a filler, (X) a cure modifier, (XI) a rheology modifier, (XII) a spacer or a combination thereof.

18. The composition of claim 1, further comprising an acid acceptor, an anti-oxidant, a stabilizer, a flame retardant, a flow control additive, a reactive diluent, an anti-settling agent, a silylating agent, a desiccant, a blowing agent, or combinations thereof.

19. The composition of claim 1, where the composition adheres to metals.

20. The composition of claim 1, where the composition has SiH$_{tot}$/Vi$_{tot}$ of 1.05 to 5.0.

21. A kit comprising Part A and Part B, where
Part A comprises
  (I) a polyorganosiloxane having an average of at least two unsaturated organic groups per molecule,
  (III) a hydrosilylation catalyst,
  optionally (IV) a fluoroorganosilicone having at least one functional group reactive with component (I),
  optionally (V) an unsaturated ester-functional compound,
  optionally (VI) an adhesion promoter,
  optionally (VII) a void reducing agent,
  optionally (VIII) a pigment,
  optionally (IX) a filler,
  optionally (X) an cure modifier,
  optionally (XI) a rheology modifier,
  optionally (XII) a spacer; and
Part B comprises
  optionally (I) a polyorganosiloxane having at least two terminally-unsaturated organic groups per molecule,
  (II) an organohydrogenpolysiloxane having an average of at least two silicon-bonded hydrogen atoms per molecule,
  optionally (IV) a fluoroorganosilicone having at least one functional group reactive with component (I), component (II), or both,
  optionally (V) an unsaturated ester-functional compound,
  optionally (VI) an adhesion promoter,
  optionally (VII) a void reducing agent,
  optionally (VIII) a pigment,
  optionally (IX) a filler,
  optionally (X) an cure modifier,
  optionally (XI) a rheology modifier, and
  optionally (XII) a spacer,
with the provisos that
  at least one of Part A and Part B contains component (IV),
  at least one of Part A and Part B contains component (V),
  component (V) comprises i)

ii)

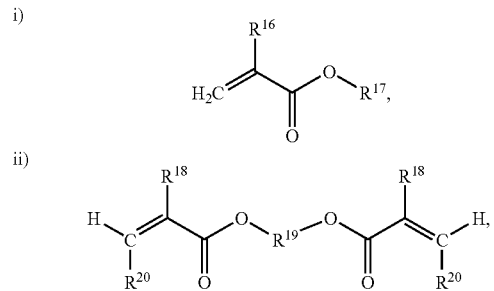

iii) 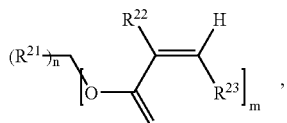

iv) 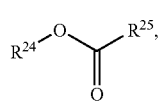

v) 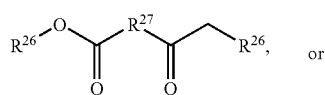

or v) a combination thereof; where
in formula i), each $R^{18}$ is independently a hydrogen atom, a monovalent hydrocarbon group of 1 to 4 carbon atoms, or $CF_3$.
each $R^{19}$ is independently a divalent organic group of 1 to 20 carbon atoms,
each $R^{20}$ is independently a hydrogen atom or a monovalent hydrocarbon group of 1 to 20 carbon atoms,
in formula ii), n has an average value of 0 to 2 and m=4−n,
each $R^{21}$ is independently a hydroxyl group, or $CF^3$,
each $R^{22}$ is independently a hydrogen atom, a monovalent hydrocarbon group of 1 to 4 carbon atoms, or $CF^3$,
each $R^{23}$ is independently a hydrogen atom or a monovalent hydrocarbon group of 1 to 20 carbon atoms,
in formula iii), each $R^{24}$ is independently a fluoroalkyl group, an epoxy functional group, or a polyether group with the proviso that at least one of $R^{24}$ or $R^{25}$ is unsaturated, each $R^{25}$ is independently an oxygen-bridged monovalent organic group or a carbon-bridged carbonyl group,
in formula iv), each $R^{26}$ is independently a monovalent organic group or a hydrogen atom, with the proviso that at least one $R^{26}$ is an aliphatically unsaturated monovalent organic group or a hydrogen atom, and each $R^{27}$ is independently an oxygen atom or a divalent organic group; and at least one of Part A and Part B contains component (VI).

22. The kit of claim 21, further comprising information or instructions or both as how to use the kit, how to combine Part A and Part B, or how to cure the resulting combination, or combinations thereof.

* * * * *